United States Patent
Konno et al.

(10) Patent No.: US 9,805,916 B2
(45) Date of Patent: Oct. 31, 2017

(54) PLASMA PROCESSING APPARATUS

(71) Applicants: Tokyo Electron Limited, Tokyo (JP); Daihen Corporation, Osaka-shi, Osaka (JP)

(72) Inventors: Hiroo Konno, Miyagi (JP); Shunsuke Kadooka, Osaka (JP)

(73) Assignees: TOKYO ELECTRON LIMITED, Tokyo (JP); DAIHEN CORPORATION, Osaka-Shi, Osaka (JP)

( * ) Notice: Subject to any disclaimer, the term of this patent is extended or adjusted under 35 U.S.C. 154(b) by 599 days.

(21) Appl. No.: 14/531,014

(22) Filed: Nov. 3, 2014

(65) Prior Publication Data

US 2015/0122421 A1 May 7, 2015

(30) Foreign Application Priority Data

Nov. 5, 2013 (JP) .................................. 2013-229497

(51) Int. Cl.
H04B 1/04 (2006.01)
H01J 37/32 (2006.01)

(52) U.S. Cl.
CPC .. *H01J 37/32146* (2013.01); *H01J 37/32091* (2013.01); *H01J 37/32165* (2013.01); *H01J 37/32183* (2013.01); *H01J 37/32926* (2013.01)

(58) Field of Classification Search
CPC ..................... H01J 37/32091; H01J 37/32155; H04B 1/04; H04B 1/0475; H04B 1/16;
(Continued)

(56) References Cited

U.S. PATENT DOCUMENTS

2009/0297404 A1* 12/2009 Shannon ........... H01J 37/32082
422/108
2012/0052689 A1* 3/2012 Tokashiki ......... H01J 37/32091
438/714
2013/0214828 A1* 8/2013 Valcore, Jr. ....... H01J 37/32146
327/141

FOREIGN PATENT DOCUMENTS

JP 2000-071292 A 3/2000
JP 2012-009544 A 1/2012
JP 2013-033856 A 2/2013

* cited by examiner

*Primary Examiner* — Douglas W Owens
*Assistant Examiner* — Wei Chan
(74) *Attorney, Agent, or Firm* — Pearne & Gordon LLP

(57) ABSTRACT

In a plasma processing apparatus, target values for feedback control to be applied to a progressive wave power PF as control parameters, i.e., control instruction values $C_{on}$ and $C_{off}$ are switched during a pulse-on period $T_{on}$ and a pulse-off period $T_{off}$ in each cycle of a modulation pulse, respectively. That is, a first feedback control for making the progressive wave power PF approximate to a first control instruction value $C_{on}$ is performed during the pulse-on period $T_{on}$, whereas a second feedback control for making the progressive wave power PF approximate to a second control instruction value $C_{off}$ is performed during the pulse-off period $T_{off}$.

8 Claims, 17 Drawing Sheets

(58) Field of Classification Search
CPC ............... H04B 1/0483; H04B 17/309; H04B 2001/0408; H04B 2001/0491; H04B 3/54; H04B 7/00; H03G 3/3042; H03H 17/08
USPC .................. 315/111.21; 156/345.28, 345.34; 118/723 E
See application file for complete search history.

*FIG. 12A*

|  |  | HF500W | | | | | | | | |
|---|---|---|---|---|---|---|---|---|---|---|
|  |  | 10 | 20 | 30 | 40 | 50 | 60 | 70 | 80 | 90 |
| LF 25W | 0.1k | OK | OK | OK | OK | NG | NG | NG | NG | NG |
|  | 1.0k | OK | OK | OK | OK | NG | NG | OK | OK | OK |
|  | 10k | OK | OK | OK | OK | OK | OK | OK | OK | OK |
|  | 20k | ✕ | OK | OK | OK | OK | OK | OK | OK | OK |
|  |  | 10 | 20 | 30 | 40 | 50 | 60 | 70 | 80 | 90 |
| LF 100W | 0.1k | OK | OK | OK | OK | OK | OK | OK | NG | NG |
|  | 1.0k | OK | OK | OK | NG | NG | OK | OK | OK | OK |
|  | 10k | OK | OK | OK | OK | OK | OK | OK | OK | OK |
|  | 20k | ✕ | OK | OK | OK | OK | OK | OK | OK | OK |
|  |  | 10 | 20 | 30 | 40 | 50 | 60 | 70 | 80 | 90 |
| LF 500W | 0.1k | OK | OK | OK | NG | OK | OK | NG | NG | NG |
|  | 1.0k | OK | OK | OK | NG | OK | OK | OK | OK | OK |
|  | 10k | OK | OK | OK | OK | OK | OK | OK | OK | OK |
|  | 20k | ✕ | OK | OK | OK | OK | OK | OK | OK | OK |
|  |  | 10 | 20 | 30 | 40 | 50 | 60 | 70 | 80 | 90 |
| LF 1000W | 0.1k | OK | OK | OK | OK | OK | OK | NG | NG | NG |
|  | 1.0k | OK | OK | OK | OK | OK | OK | OK | OK | OK |
|  | 10k | OK | OK | OK | OK | OK | OK | OK | OK | OK |
|  | 20k | ✕ | OK | OK | OK | OK | OK | OK | OK | OK |
|  |  | 10 | 20 | 30 | 40 | 50 | 60 | 70 | 80 | 90 |
| LF 2000W | 0.1k | OK | OK | OK | NG | OK | OK | NG | NG | NG |
|  | 1.0k | OK | OK | OK | OK | OK | OK | OK | OK | OK |
|  | 10k | OK | OK | OK | OK | OK | OK | OK | OK | OK |
|  | 20k | ✕ | OK | OK | OK | OK | OK | OK | OK | OK |

FIG. 12B

| | | HF1000W | | | | | | | | |
|---|---|---|---|---|---|---|---|---|---|---|
| | | 10 | 20 | 30 | 40 | 50 | 60 | 70 | 80 | 90 |
| LF 25W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 100W | 0.1k | OK | OK | OK | OK | OK | NG | NG | NG | OK |
| | 1.0k | OK | OK | OK | OK | OK | NG | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 500W | 0.1k | OK | OK | OK | OK | OK | OK | NG | NG | NG |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 1000W | 0.1k | OK | OK | OK | OK | OK | OK | NG | NG | NG |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 2000W | 0.1k | OK | OK | OK | NG | NG | NG | NG | OK | OK |
| | 1.0k | OK | OK | OK | NG | OK | OK | OK | OK | OK |
| | 10k | OK | OK | OK | NG | OK | OK | OK | OK | OK |
| | 20k | ✕ | OK | OK | OK | OK | OK | OK | OK | OK |

*FIG. 13A*

| | | HF500W | | | | | | | | |
|---|---|---|---|---|---|---|---|---|---|---|
| | | 10 | 20 | 30 | 40 | 50 | 60 | 70 | 80 | 90 |
| LF 25W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 100W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 500W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 1000W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 2000W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |

*FIG. 13B*

| | | HF1000W | | | | | | | | |
|---|---|---|---|---|---|---|---|---|---|---|
| | | 10 | 20 | 30 | 40 | 50 | 60 | 70 | 80 | 90 |
| LF 25W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 100W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 500W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 1000W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |
| | | 10 | 20 | 30 | 40 | 50 | 60 | 70 | 80 | 90 |
| LF 2000W | 0.1k | OK | OK | OK | OK | OK | OK | OK | OK | OK |
| | 1.0k | OK | OK | OK | OK | OK | OK | OK | OK | OK |
| | 10k | OK | OK | OK | OK | OK | OK | OK | OK | OK |
| | 20k | ✕ | OK | OK | OK | OK | OK | OK | OK | OK |

PLASMA PROCESSING APPARATUS

CROSS-REFERENCE TO RELATED APPLICATION

This application claims the benefit of Japanese Patent Application No. 2013-229497 filed on Nov. 5, 2013, the entire disclosures of which are incorporated herein by reference.

TECHNICAL FIELD

The embodiments described herein pertain generally to a technique of performing a plasma process on a processing target object; and, more particularly, to a power modulation type plasma processing apparatus of pulse-modulating either one of two kinds of high frequency powers to be supplied into a processing vessel.

BACKGROUND

Generally, in a plasma processing apparatus, plasma of a processing gas is generated within a decompression processing vessel. Further, a thin film is formed on a processing target object within the processing vessel by a gas phase reaction or a surface reaction of radicals or ions included in the generated plasma, or micro-processing such as etching of a material or a thin film on a surface of the processing target object is performed.

For example, a capacitively coupled plasma processing apparatus includes an upper electrode and a lower electrode arranged in parallel to each other within a processing vessel. A processing target object (e.g., a semiconductor wafer, a glass substrate, etc) is mounted on the lower electrode, and a high frequency power having a frequency (typically, 13.56 MHz or higher) suitable for plasma generation is applied to the upper electrode or the lower electrode. Electrons are accelerated in a high frequency electric field generated between the two facing electrodes by applying the high frequency power, and plasma is generated as a result of ionization by collision between the electrons and a processing gas.

Recently, as a design rule is getting more miniaturized in a manufacturing process of a semiconductor device or the like, higher level of dimensional accuracy is required in, especially, the plasma etching. Further, it is required to increase etching selectivity against a mask or an underlying film and to improve etching uniformity in the entire surface of a substrate. For this reason, a pressure and ion energy in a processing region within a chamber tends to be reduced, so that a high frequency power having a high frequency equal to or higher than 40 MHz is used.

However, as the pressure and the ion energy are reduced, an influence of a charging damage, which has been negligible conventionally, can be no more neglected. That is, in a conventional plasma processing apparatus having the high ion energy, no serious problem may occur even when a plasma potential is non-uniform in the entire surface of the substrate. However, if the ion energy is lowered at a lower pressure, the non-uniformity of the plasma potential in the entire surface of the substrate may easily cause the charging damage on a gate oxide film.

In this regard, to solve the above-mentioned problem, a method of pulse-modulating a high frequency power for plasma generation with an on/off (or H level/L level) pulse having a controllable duty ratio (hereinafter, referred to as "first power modulation method") has been considered effective. According to this first power modulation method, a plasma generation state in which plasma of a processing gas is being generated and a plasma non-generation state in which the plasma is not being generated are alternately repeated at a preset cycle during a plasma etching process. Accordingly, as compared to a typical plasma process in which plasma is continuously generated from the beginning of the process to the end thereof, a time period during which plasma is continuously generated may be shortened. As a result, the amount of electric charges introduced into a processing target object from the plasma at one time or the amount of electric charges accumulated on the surface of the processing target object may be reduced, so that the charging damage is suppressed from being generated. Therefore, a stable plasma process can be performed and reliability of the plasma process can be improved.

Further, conventionally, in the plasma processing apparatus, a RF bias method is widely employed. In this RF bias method, a high frequency power having a relatively low frequency (typically, 13.56 MHz or lower) is applied to the lower electrode on which the processing target object is mounted, and ions in plasma are accelerated and attracted to the processing target object by a negative bias voltage or a sheath voltage generated on the lower electrode. In this way, by accelerating the ions in the plasma and bringing them into collision with the surface of the processing target object, a surface reaction, an anisotropic etching or a film modification may be facilitated.

However, when performing the etching process to form via holes or contact holes by using the plasma etching apparatus, a so-called micro-loading effect may occur. That is, an etching rate may differ depending on the hole size, so that it is difficult to control an etching depth. Especially, the etching rate tends to be higher at a large area such as a guide ring (GR), whereas the etching rate tends to be lower at a small via into which CF-based radicals are difficult to be introduced.

In this regard, to solve the above-stated problem, a method of pulse-modulating a high frequency power used for ion attraction with an on/off (or H level/L level) pulse having a controllable duty ratio (hereinafter, referred to as "second power modulation method") has been considered effective. According to the second power modulation method, a period during which an on-state (or H-level) of a relatively high power suitable for etching a preset film on the processing target object is maintained and a period during which an off-state (or L-level) of a relatively low power (a high frequency power for ion attraction) suitable for depositing polymer on a preset film on the processing target object is maintained are alternately repeated at a certain cycle. Accordingly, at an area having a larger hole size, a proper polymer layer may be deposited on the preset film at a higher deposition rate, so that the etching may be suppressed. Thus, an undesirable micro-loading effect may be reduced, and it may be possible to perform an etching process with a high selectivity and a high etching rate.

Patent Document 1: Japanese Patent Laid-open Publication No. 2000-071292

Patent Document 2: Japanese Patent Laid-open Publication No. 2012-009544

Patent Document 3: Japanese Patent Laid-open Publication No. 2013-033856

In general, a high frequency power supply provided in a plasma processing apparatus, particularly, a high frequency power supply which applies a high frequency power for plasma generation or a high frequency power for ion attraction into the processing vessel as mentioned above is configured to perform either a control (hereinafter, referred to as "PF control") under which a power level of the high frequency power outputted therefrom, i.e., a power level of a progressive wave power is maintained constant or a control (hereinafter, referred to as "PL control") under which a power level of a net input power (hereinafter, referred to as "load power"), which is obtained by subtracting a reflection wave power from the progressive wave power, is maintained constant.

When using the first power modulation method or the second power modulation method in a plasma process, a power of a high frequency power to be pulse-modulated varies in a step-shape between the on-state (or H-level) and the off-state (or L-level) of a modulation pulse, so that a load (plasma) greatly pulsates periodically. Accordingly, in the high frequency power supply that outputs a high frequency power of a continuous wave CW without undergoing the power modulation, neither the PF control nor the PL control may be performed appropriately.

That is, in case of the PF control, as shown in FIG. 14, even if an output of the high frequency power supply, i.e., a progressive wave power PF is maintained constant at a set value $PF_S$, a reflection wave power PR may be varied periodically depending on a variation load (plasma) in synchronization with a modulation pulse, so that a load power PL (PL=PF−PR) is varied periodically. If the load power PL is varied periodically, plasma hunting may easily occur in the high frequency power for plasma generation. Meanwhile, in the high frequency power for ion attraction, ion energy incident on the processing target object may be varied. In any cases, a stable plasma process may not be achieved.

Meanwhile, in the PL control, as depicted in FIG. 15, even if the reflection wave power PR is varied in synchronization with the modulation pulse, it is still possible to maintain the load power PL at a set value $PL_S$ by controlling the progressive wave power PF through a feedback route such that the variation of the reflection wave power PR is canceled.

Actually, however, according to the conventional PL control, it is difficult to follow up the periodic variation of the reflection wave power PR and the periodic variation of the progressive wave power PF promptly and effectively through the feedback control. Especially, since the feedback control cannot follow up a rapid load variation that occurs when the modulation pulse is inverted, it is difficult to maintain the load power PL at the set value $PL_S$ stably, as depicted in FIG. 16.

SUMMARY

In view of the foregoing problems, example embodiments provide a plasma processing apparatus capable of, when pulse-modulating one of two kinds of high frequency powers to be applied into a processing vessel in a shape, controlling a load power to a set value stably in a high frequency power supply configured to output a high frequency power of a continuous wave without power modulation.

In an example embodiment, a plasma processing apparatus generates plasma by high frequency discharge of a processing gas within a decompression processing vessel that accommodates therein a processing target object, which is loaded into and unloaded from the processing vessel, and performs a process on the processing target object within the processing vessel under the plasma. The plasma processing apparatus includes a first high frequency power supply configured to output a first high frequency power; a first high frequency transmission line configured to transmit the first high frequency power outputted from the first high frequency power supply to a first electrode provided within or in the vicinity of the processing vessel; a second high frequency power supply configured to output a second high frequency power; a second high frequency transmission line configured to transmit the second high frequency power outputted from the second high frequency power supply to the first electrode or a second electrode provided within or in the vicinity of the processing vessel; and a power modulation unit configured to pulse-modulate an output of the second high frequency power supply with a pulse such that a first period during which the second high frequency power is turned on or has a first level and a second period during which the second high frequency power is turned off or has a second level lower than the first level are repeated alternately at a regular frequency. Further, the first high frequency power supply includes a RF power monitor configured to detect a progressive wave power propagating on the first high frequency transmission line from the first high frequency power supply toward the first electrode in a forward direction and a reflection wave power propagating on the first high frequency transmission line from the first electrode toward the first high frequency power supply in a backward direction, and configured to generate a progressive wave power detection signal indicating the progressive wave power and a reflection wave power detection signal indicating the reflection wave power; a load power measurement unit configured to calculate a measurement value of a load power applied to a load including the plasma from the progressive wave power detection signal and the reflection wave power detection signal obtained from the RF monitor; and a high frequency power output control unit configured to perform feedback controls on the progressive wave power during the first period and the second period, independently and respectively, in each cycle of the pulse such that the measurement value of the load power obtained from the load power measurement unit is equal to or approximate to a preset load power set value.

In the above configuration, since the output of the second high frequency power supply is pulse-modulated by the power modulation unit with the pulse, the load (plasma) fluctuates greatly between the first period and the second period in each cycle of the pulse, so that the reflection wave power may be greatly changed in the first high frequency power supply without undergoing the power modulation. In the first high frequency power supply, since the feedback controls are performed on the progressive wave power during the first period and the second period, independently and respectively, in each cycle of the pulse by the high frequency power output control unit, it is possible to follow up periodic variation of the reflection wave power and periodic variation of the progressive wave power promptly and effectively through the feedback controls in synchronization with the modulation pulse. Especially, since the feedback controls can follow up a rapid load variation that occurs when the modulation pulse is inverted, it is possible to maintain the load power at a set value stably.

In the plasma processing apparatus in accordance with the example embodiments, with the above-described configuration and operation, when pulse-modulating one of two kinds of the high frequency powers to be applied into the processing vessel with the pulse, it is possible to control the load power to be the set value stably in the high frequency power supply configured to output the high frequency power of the continuous wave without the power modulation.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 12A is a table showing experimental results upon plasma stability obtained through a general PF control in a plasma etching experiment using the power modulation method;

FIG. 12B is, like FIG. 12A, a table showing experimental results obtained through the general PF control;

FIG. 13A is a table showing experimental results upon plasma stability obtained through a PL control in accordance with the example embodiment in a plasma etching experiment using the power modulation method;

FIG. 13B is, like FIG. 13A, a table showing experimental results obtained through the PL control in accordance with the example embodiment;

DETAILED DESCRIPTION

Figure 1:
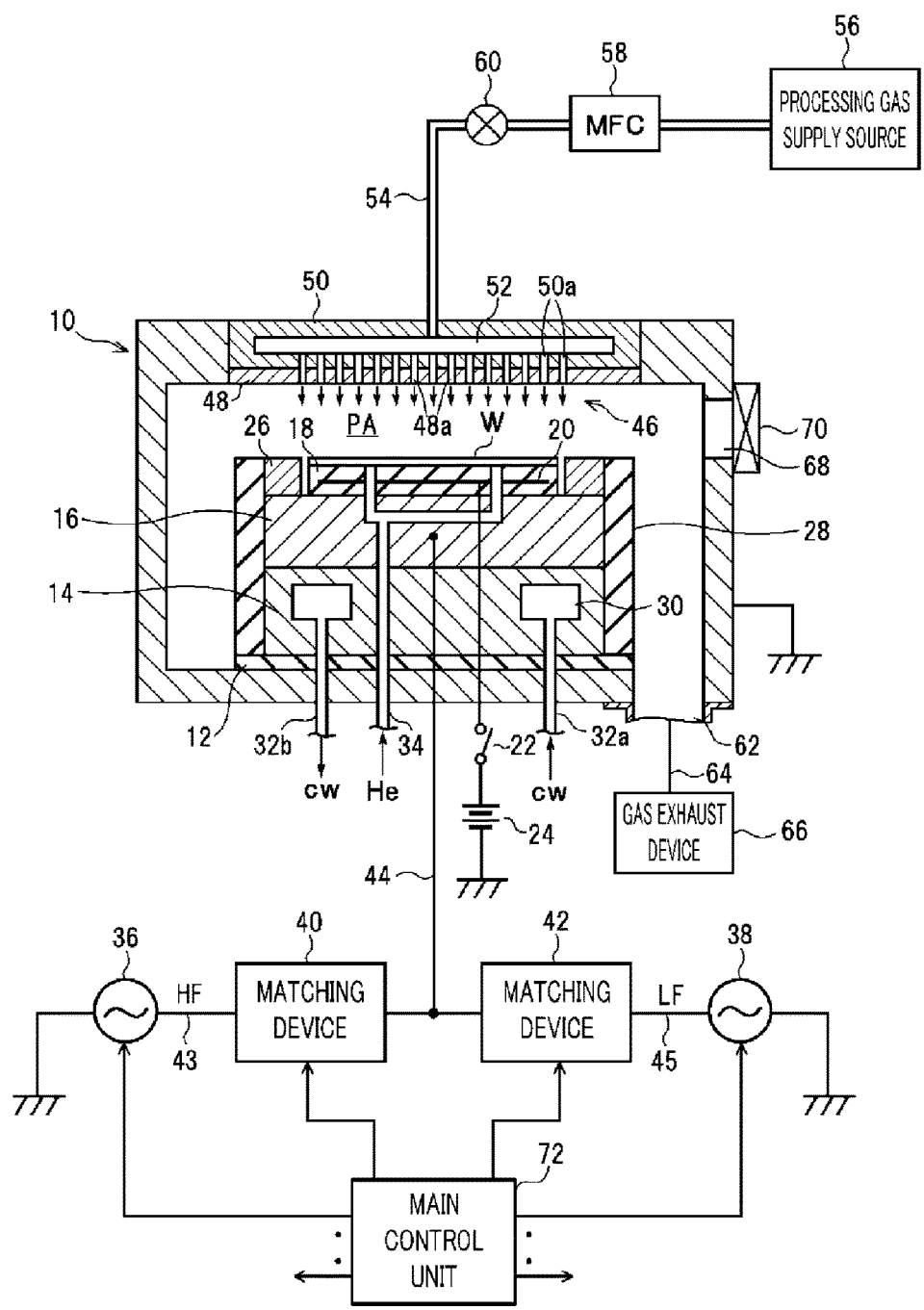
FIG. 1 is a cross sectional view illustrating a configuration of a capacitively coupled plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

<Configuration of Plasma Processing Apparatus>

FIG. 1 shows a configuration of a plasma processing apparatus in accordance with an example embodiment. This plasma processing apparatus is configured as a capacitively coupled (parallel plate type) plasma etching apparatus in which dual high frequency powers are applied to a lower electrode. By way of example, the plasma processing apparatus includes a cylindrical decompression chamber (processing vessel) 10 made of, but not limited to, aluminum having an alumite-treated (anodically oxidized) surface. The chamber 10 is grounded.

A circular columnar susceptor supporting member 14 is provided on an insulating plate 12 such as ceramic on a bottom of the chamber 10, and a susceptor 16 made of, but not limited to, aluminum is provided on the susceptor supporting member 14. The susceptor 16 serves as a lower electrode, and a processing target object, e.g., a semiconductor wafer W is mounted on the susceptor 16.

An electrostatic chuck 18 configured to hold the semiconductor wafer W is provided on a top surface of the susceptor 16. The electrostatic chuck 18 includes a pair of insulating layers or insulating sheets; and an electrode 20 embedded therebetween. The electrode 20 is made of a conductive film and is electrically connected with a DC power supply 24 via a switch 22. The semiconductor wafer W can be held on the electrostatic chuck 18 by an electrostatic adsorptive force generated by a DC voltage applied from the DC power supply 24. In order to improve etching uniformity, a focus ring 26 made of, but not limited to, silicon is provided on the top surface of the susceptor 16 to surround the electrostatic chuck 18. A cylindrical inner wall member 28 made of, but not limited to, quartz is attached to side surfaces of the susceptor 16 and the susceptor supporting member 14.

A coolant path 30 extended in, e.g., a circumferential direction is provided within the susceptor supporting member 14. A coolant of a preset temperature, e.g., cooling water cw from an external chiller unit (not shown) is supplied into and circulated through the coolant path 30 via pipelines 32a and 32b. A processing temperature of the semiconductor wafer W on the susceptor 16 can be controlled by adjusting the temperature of the coolant. Further, a heat transfer gas, e.g., a He gas from a heat transfer gas supplying device (not shown) is supplied into a gap between a top surface of the electrostatic chuck 18 and a rear surface of the semiconductor wafer W through a gas supply line 34.

The susceptor 16 is electrically connected with high frequency power supplies 36 and 38 via matching devices 40 and 42, respectively, and a common power supply conductor (for example, a power supply rod) 44. One high frequency power supply 36 outputs a high frequency power HF having a frequency $f_{HF}$ (for example, 40 MHz) suitable for plasma generation. Meanwhile, the other high frequency power supply 38 outputs a high frequency power LF having a frequency $f_{LF}$ (for example, 12.88 MHz) suitable for ion attraction to the semiconductor wafer W on the susceptor 16 from the plasma.

As such, the matching device 40 and the power supply rod 44 constitute a part of a high frequency transmission line (high frequency transmission path) 43 configured to transmit the high frequency power HF for plasma generation from the high frequency power supply 36 to the susceptor 16. Meanwhile, the matching device 42 and the power supply rod 44 constitute a part of a high frequency transmission line (high frequency transmission path) 45 configured to transmit the high frequency power LF for ion attraction from the high frequency power supply 38 to the susceptor 16.

An upper electrode 46 having a ground potential is provided at a ceiling of the chamber 10, facing the susceptor 16 in parallel. The upper electrode 46 includes an electrode plate 48 which has a multiple number of gas discharge holes 48a and is made of, e.g., a silicon-containing material such as Si or SiC; and an electrode supporting body 50 which detachably supports the electrode plate 48 and is made of a conductive material such as aluminum having an alumite-treated surface. A plasma generation space or a processing space PA is formed between the upper electrode 46 and the susceptor 16.

The electrode supporting body 50 has a gas buffer room 52 formed therein. The electrode supporting body 50 also has, in its bottom surface, a multiple number of gas holes 50a extended from the gas buffer room 52, and the gas holes 50a communicate with the gas discharge holes 48a of the electrode plate 48, respectively. The gas buffer room 52 is connected to a processing gas supply source 56 via a gas supply line 54. The processing gas supply source 56 is provided with a mass flow controller (MFC) 58 and an opening/closing valve 60. If a certain processing gas (etching gas) is introduced into the gas buffer room 52 from the processing gas supply source 56, the processing gas is then discharged in a shower shape from the gas discharge holes 48a of the electrode plate 48 into the processing space PA toward the semiconductor wafer W on the susceptor 16. In this configuration, the upper electrode 46 also serves as a shower head that supplies the processing gas into the processing space PA.

Further, a passageway (not shown) in which a coolant, e.g., cooling water flows may be provided within the electrode supporting body 50. The entire upper electrode 46, especially, the electrode plate 48 is controlled to have a preset temperature through the coolant by an external chiller unit. Further, in order to stabilize the temperature control over the upper electrode 46, a heater (not shown) including a resistance heating device may be provided within or on a top surface of the electrode supporting body 50.

An annular space formed between a sidewall of the chamber 10, and the susceptor 16 and the susceptor supporting member 14 serves as a gas exhaust space, and a gas exhaust opening 62 of the chamber 10 is formed at a bottom of this gas exhaust space. The gas exhaust opening 62 is connected to a gas exhaust device 66 via a gas exhaust line 64. The gas exhaust device 66 includes a vacuum pump such as a turbo molecular pump and is configured to depressurize the inside of the chamber 10, particularly, the processing space PA to a required vacuum level. Further, a gate valve 70 configured to open and close a loading/unloading opening 68 for the semiconductor wafer W is provided at the sidewall of the chamber 10.

A main control unit 72 includes one or more microcomputers and is configured to control an overall operation (sequence) of the apparatus and individual operations of respective components within the apparatus, particularly, the high frequency power supplies 36 and 38, the matching devices 40 and 42, the MFC 58, the opening/closing valve 60, the gas exhaust device 66, etc., according to software (program) and recipes stored in an external memory or an internal memory.

Further, the main control unit 72 is connected to a man-machine interface manipulation panel (not shown) including an input device such as a keyboard and a display device such as a liquid crystal display and, also, connected to an external storage device (not shown) that stores various types of data such as various programs or recipes, setting values, etc. In the present example embodiment, the main control unit 72 is configured as a single control unit. However, it may be also possible to adopt a configuration in which multiple control units divide up the functions of the main control unit 72 individually or hierarchically. Especially, a part of the functions of the main control unit 72 may be included in the matching devices 40 and 42.

A basic operation of single-sheet typed dry etching in the capacitively coupled plasma etching apparatus configured as described above is performed as follows. First, the gate valve 70 is opened, and a semiconductor wafer W to be processed is loaded into the chamber 10 and mounted on the electrostatic chuck 18. Then, a processing gas, i.e., an etching gas (generally, a gaseous mixture) is introduced into the chamber 10 from the processing gas supply source 56 at a preset flow rate and a preset flow rate ratio, and the inside of the chamber 10 is evacuated to be a set vacuum pressure by the gas exhaust device 66. Further, the high frequency power HF (40 MHz) for plasma generation and the high frequency power LF (12.88 MHz) for ion attraction from the high frequency power supplies 36 and 38 are overlapped at preset powers, respectively, to be applied to the susceptor 16. Further, a DC voltage from the DC power supply 24 is applied to the electrode 20 of the electrostatic chuck 18, so that the semiconductor wafer W is held on the electrostatic chuck 18. The etching gas discharged from the upper electrode 46 serving as the shower head is electrically discharged under a high frequency electric field between the two electrodes 46 and 16, so that plasma is generated in the processing space PA. An etching target film on a main surface of the semiconductor wafer W is etched by radicals or ions included in the plasma.

In this plasma etching apparatus, for example, to solve the above-described problem of charging damage, a first power modulation method of pulse-modulating a high frequency power HF for plasma generation outputted from the high frequency power supply 36 with a modulation pulse MS having a regular frequency $f_S$ selected within a range of, for example, 1 kHz to 100 kHz and a variable duty ratio $D_S$ can be performed on the etching process.

Figure 2A:
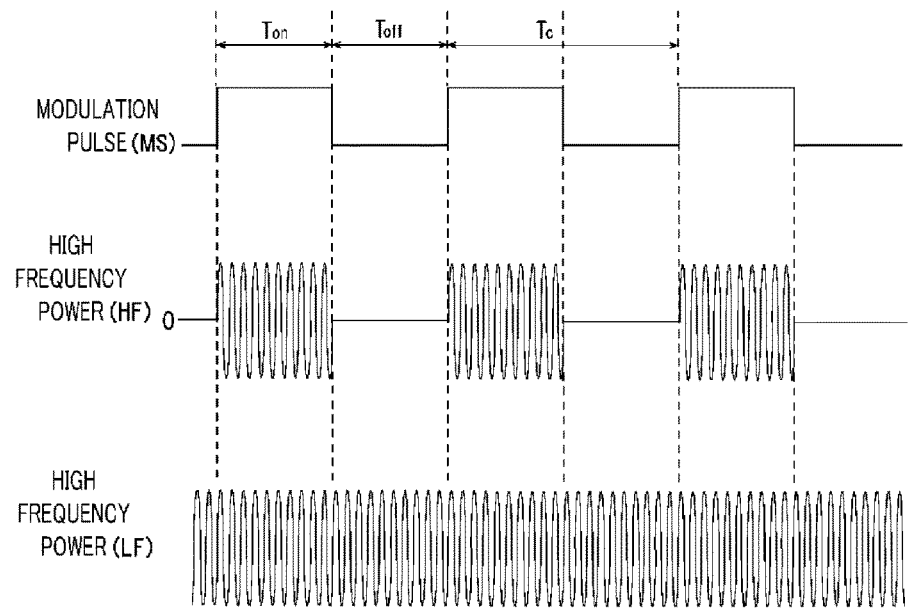
FIG. 2A provides diagrams showing waveforms of respective components for describing a first power modulation method.

In this case, the main control unit 72 sends a control signal instructing the power modulation as a RF output mode to the high frequency power supply 36 for the plasma generation system and applies thereto the modulation pulse MS defining the frequency $f_S$ and the duty ratio $D_S$ for the power modulation. The high frequency power supply 36 turns on and off the high frequency power HF in synchronization with the modulation pulse MS, as depicted in FIG. 2A. Here, assuming that a cycle, an on-period (first period) and an off-period (second period) of the modulation pulse MS are set to $T_{C1}$, $T_{on}$, and $T_{off}$, respectively, relational expressions of $T_C=1/f_S$, $T_C=T_{on}+T_{off}$, and $D_S=T_{on}/(T_{on}+T_{off})$ are established.

Meanwhile, when using the first power modulation method, the main control unit 72 sends a control signal instructing a continuous wave as a RF output mode to the high frequency power supply 38 for ion attraction and applies the same pulse as the modulation pulse MS or a timing signal in synchronization with the pulse to the high frequency power supply 38.

Further, in this plasma etching apparatus, to solve the above-described problem of micro-loading effect, a second power modulation method of pulse-modulating a high frequency power LF for ion attraction outputted from the high frequency power supply 38 with a modulation pulse MS having a regular frequency $f_S$ selected within a range of, for example, 100 Hz to 50 kHz and a variable duty ratio $D_S$ may also be performed on the etching process.

Figure 2B:
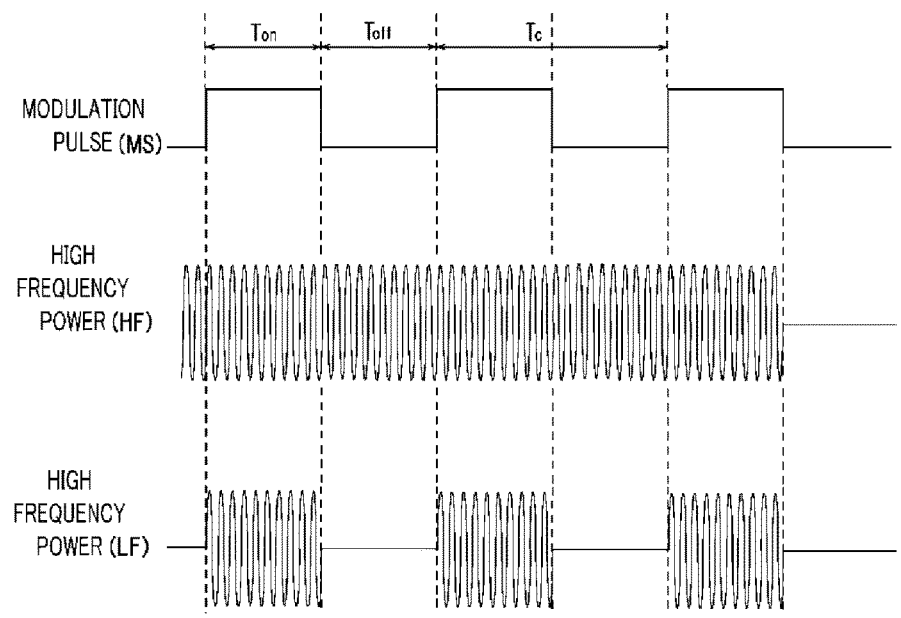
FIG. 2B provides diagrams showing waveforms of respective components for describing a second power modulation method.

In this case, the main control unit 72 sends a control signal instructing the power modulation as a RF output mode to the high frequency power supply 38 for ion attraction and applies thereto the modulation pulse MS defining the frequency $f_S$ and the duty ratio $D_S$ for the power modulation. The high frequency power supply 38 turns on and off the high frequency power LF for ion attraction in synchronization with the modulation pulse MS, as depicted in FIG. 2B. Here, assuming that a cycle, an on-period (first period) and an off-period (second period) of the modulation pulse MS are set to $T_C$, $T_{on}$, and $T_{off}$, respectively, relational expressions of $T_C=1/f_S$, $T_C=T_{on}+T_{off}$, and $D_S=T_{on}/(T_{on}+T_{off})$ are established.

Meanwhile, when using the second power modulation method, the main control unit 72 sends a control signal instructing the high frequency power supply 36 of the plasma generation system to output a continuous wave CW as a RF output mode and applies the same pulse as the modulation pulse MS or a timing signal in synchronization with the pulse to the high frequency power supply 36.

<Configuration of High Frequency Power Supply and Matching Device of Plasma Generation System>

Figure 3:
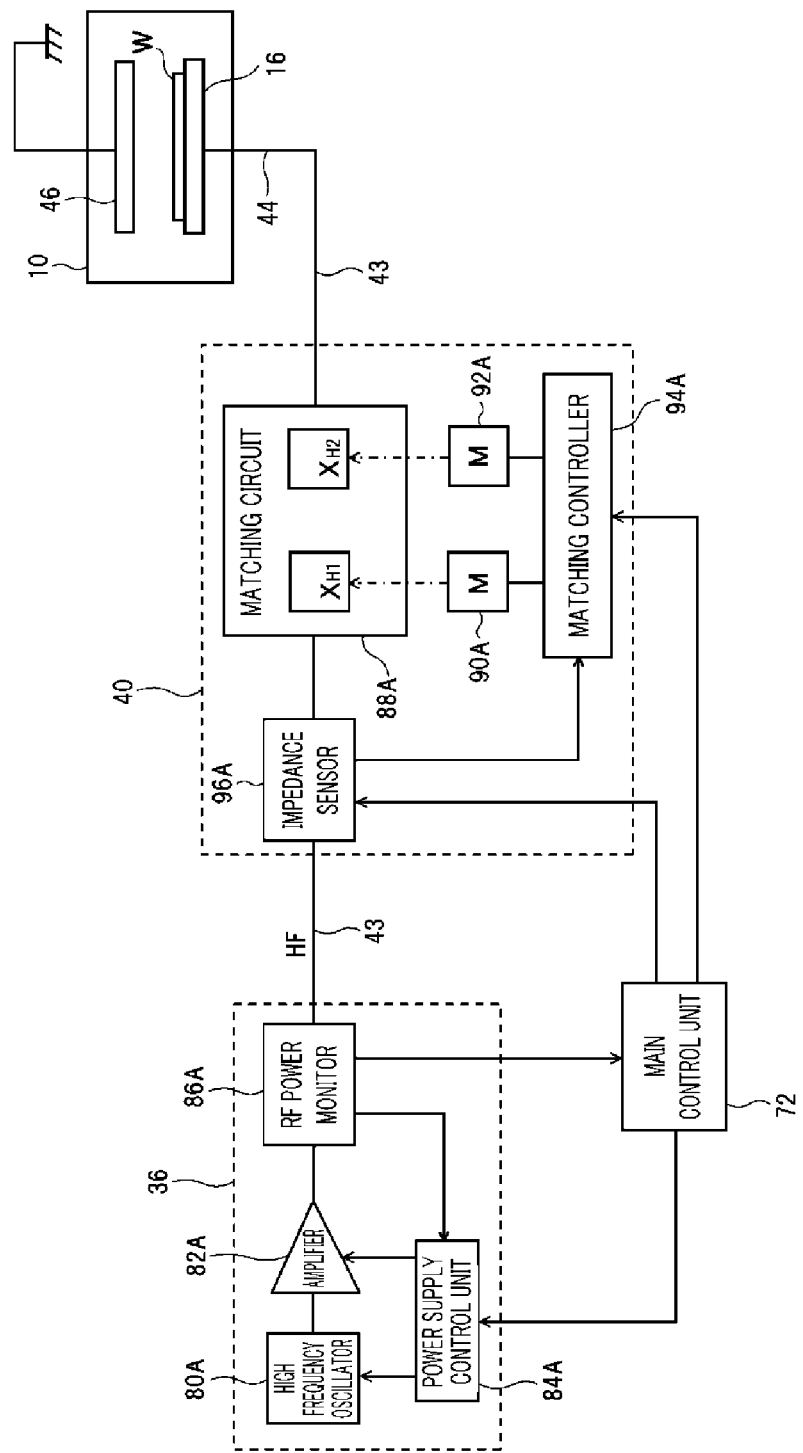
FIG. 3 is a block diagram illustrating a configuration of a matching device and a high frequency power supply for plasma generation.

FIG. 3 illustrates a configuration of the high frequency power supply 36 and a matching device 40 of the plasma generation system.

The high frequency power supply 36 includes a high frequency oscillator 80A configured to generate a sine wave or a fundamental wave of a regular frequency (for example, 40 MHz) suitable for plasma generation by high frequency discharge; a power amplifier 82A configured to amplify a power of the fundamental wave outputted from the high frequency oscillator 80A with a controllable gain or amplification factor; and a power supply control unit 84A configured to directly control the high frequency oscillator 80A and the power amplifier 82A in response to a control signal from the main control unit 72. The main control unit 72 sends, to the power supply control unit 84A, not only the control signal instructing the RF output mode or the modulation pulse MS, but also control signals regarding typical power on/off or power interlock relation and data such as power set values. When the first power modulation method (FIG. 2A) is performed in this plasma processing apparatus, the power supply control unit 84A constitutes a power modulation unit under the control of the main control unit 72.

The high frequency power supply 36 also includes a RF power monitor 86A. The RF power monitor 86A includes a directional coupler on the high frequency transmission line 43. This RF power monitor 86A is configured to detect a progressive wave power PF propagating on the high frequency transmission line 43 in a forward direction and a reflection wave power PR propagating on the high frequency transmission line 43 in a backward direction. and configured to generate analog signals corresponding to the progressive wave power PF and the reflection wave power PR, i.e., a progressive wave power detection signal $S_{PF}$ and a reflection wave power detection signal $S_{PR}$, respectively.

The progressive wave power detection signal $S_{PF}$ and the reflection wave power detection signal $S_{PR}$ obtained from the RF power monitor 86A are sent to the power supply control unit 84A within the high frequency power supply 36 for power feedback control. Further, a measurement value of the reflection wave power PR obtained by the RF power monitor 86A is sent to the main control unit 72 for monitor display.

The matching device 40 includes a matching circuit 88A including multiple, for example, two controllable reactance elements (for example, variable capacitors or variable inductors) $X_{H1}$ and $X_{H2}$ connected to the high frequency transmission line 43; a matching controller 94A configured to control reactances of the reactance elements $X_{H1}$ and $X_{H2}$ via actuators such as motors (M) 90A and 92A; and an impedance sensor 96A configured to measure load impedance including impedance of the matching circuit 88A on the high frequency transmission line 43.

<Configuration of High Frequency Power Supply and Matching Device of Ion Attraction System>

Figure 4:
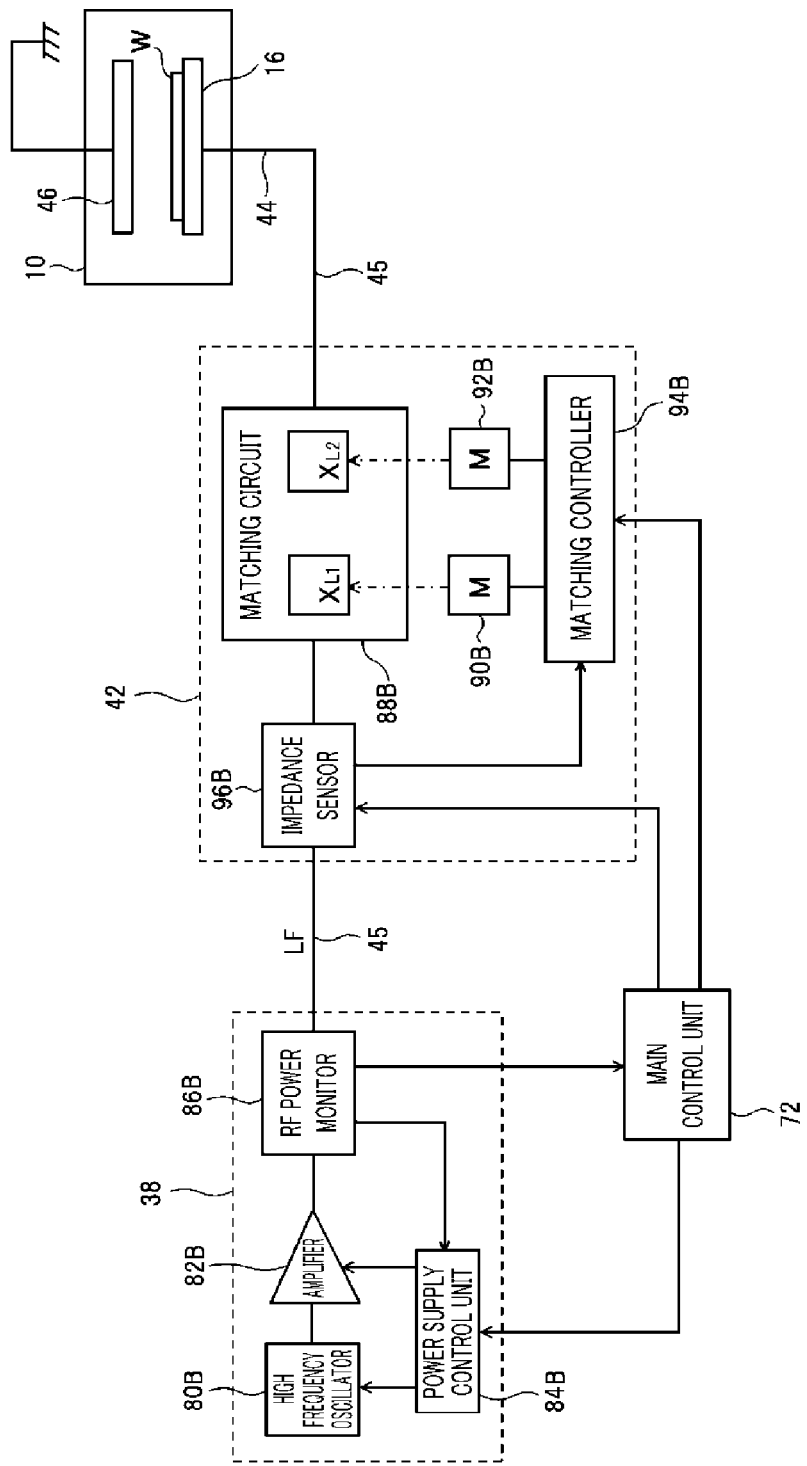
FIG. 4 is a block diagram illustrating a configuration of a matching device and a high frequency power supply for ion attraction.

FIG. 4 illustrates a configuration of the high frequency power supply 38 for ion attraction and the matching device 42 in accordance with the example embodiment.

The high frequency power supply 38 includes a high frequency oscillator 80B configured to generate a sine wave or a fundamental wave of a regular frequency (for example, 12.88 MHz) suitable for ion attraction from the plasma into the semiconductor wafer W on the susceptor 16; a power amplifier 82B configured to amplify a power of the fundamental wave outputted from the high frequency oscillator 80B with a controllable gain or amplification factor; and a power supply control unit 84B configured to directly control the high frequency oscillator 80B and the power amplifier 82B in response to a control signal from the main control unit 72; and a RF power monitor 86B. The components 80B to 86B within the high frequency power supply 38 respectively have the same configurations and the same functions as the components 80A to 86A within the high frequency power supply 36 except that the frequency (12.88 MHz) of the high frequency oscillator 80B is different from the frequency (40 MHz) of the RF oscillator 80A. When the second power modulation method (FIG. 2B) is performed in this plasma processing apparatus, the power supply control unit 84B constitutes a power modulation unit under the control of the main control unit 72.

The RF power monitor 86B within the high frequency power supply 38 includes a directional coupler on the high frequency transmission line 45. This RF power monitor 86B is configured to detect a progressive wave power PF propagating on the high frequency transmission line 45 in a forward direction and a reflection wave power PR propagating on the high frequency transmission line 45 in a backward direction, and configured to generate analog signals corresponding to the progressive wave power PF and the reflection wave power PR, i.e., a progressive wave power detection signal $S_{PF}$ and a reflection wave power detection signal $S_{PR}$, respectively.

The progressive wave power detection signal $S_{PF}$ and the reflection wave power detection signal $S_{PR}$ obtained from the RF power monitor 86B are sent to the power supply control unit 84B within the high frequency power supply 38 for power feedback control. Further, a measurement value of the reflection wave power PR obtained by the RF power monitor 86B is sent to the main control unit 72 for monitor display.

The matching device 42 includes a matching circuit 88B including multiple, for example, two controllable reactance elements (for example, variable capacitors or variable inductors) $X_{L1}$ and $X_{L2}$ connected to the high frequency transmission line 45; a matching controller 94B configured to control reactances of the reactance elements $X_{L1}$ and $X_{L2}$ via actuators, for example, motors (M) 90B and 92B; and an impedance sensor 96B configured to measure load impedance including impedance of the matching circuit 88B on the high frequency transmission line 45.267-[0048].

<Configuration of Major Components within Power Supply Control Unit>

Figure 5:
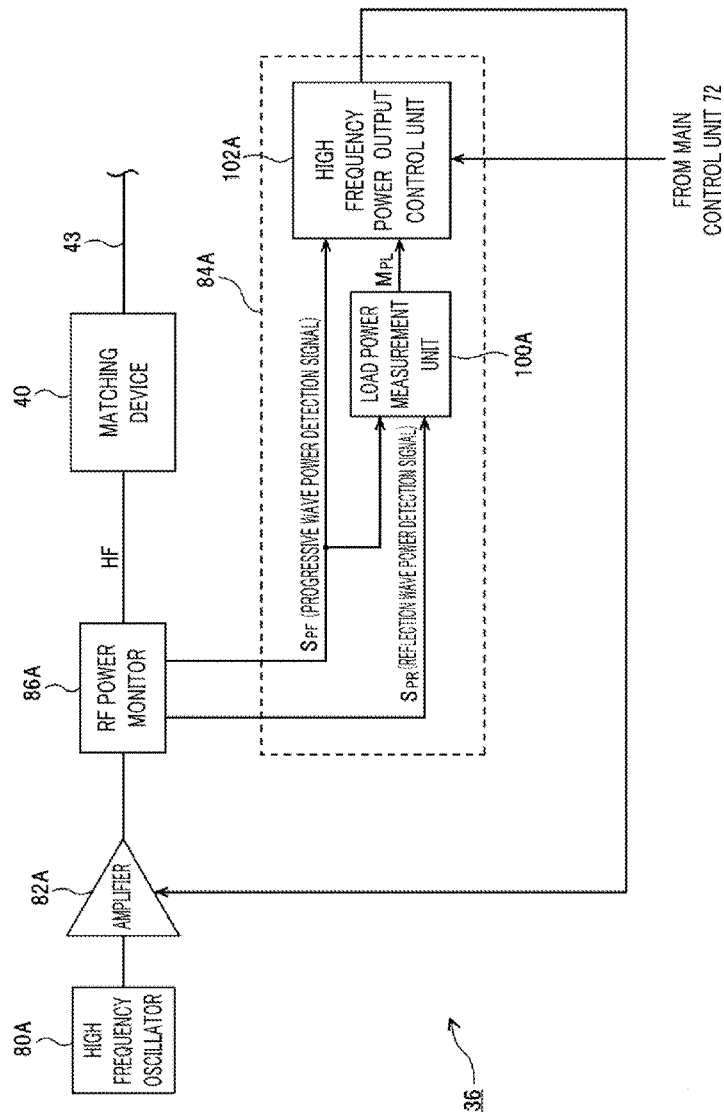
FIG. 5 is a block diagram illustrating a configuration of a power supply control unit and a RF power monitor of FIG. 3.
Figure 6:
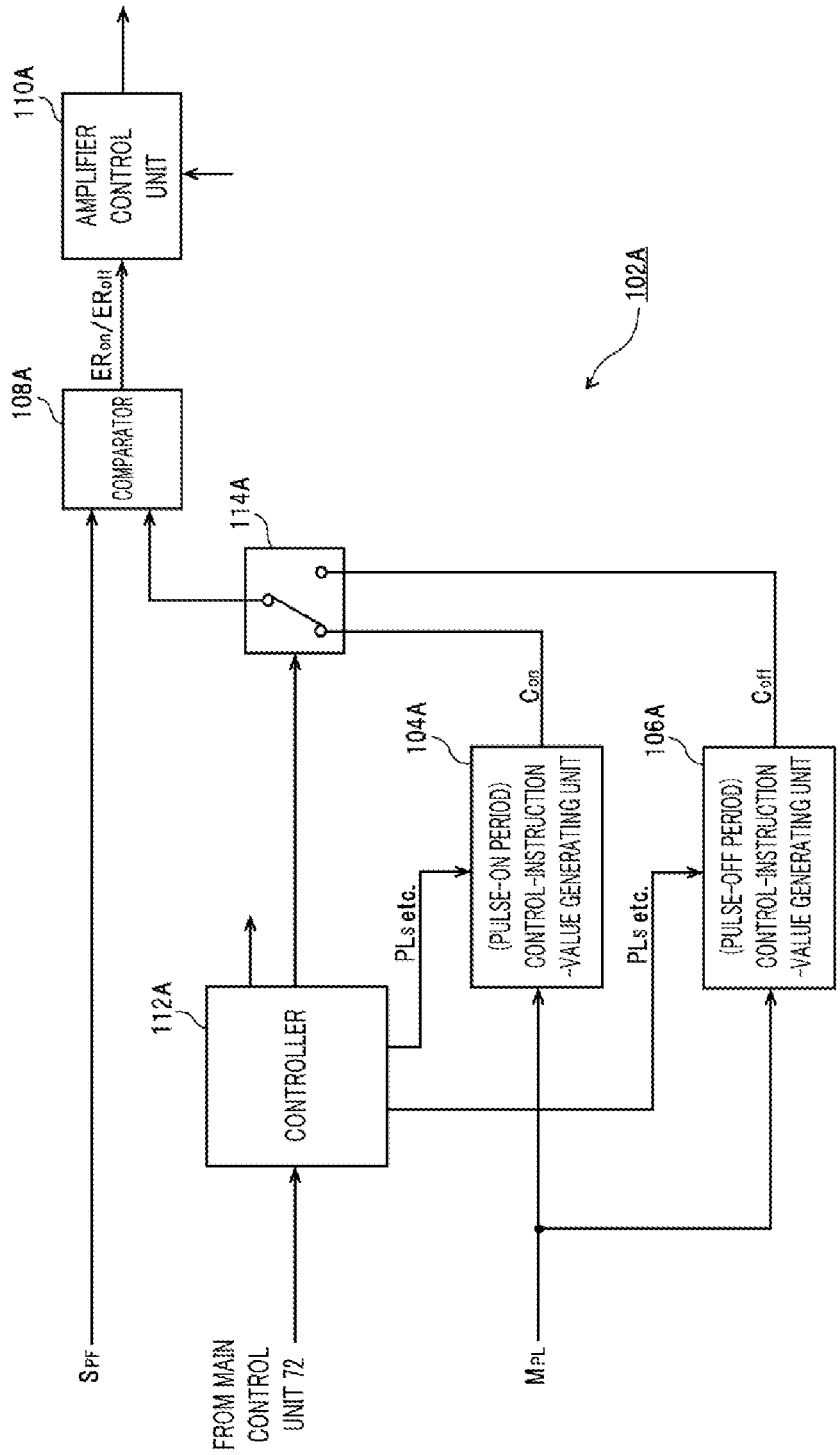
FIG. 6 is a block diagram illustrating an internal configuration of a high frequency power output control unit of FIG. 5.

FIG. 5 and FIG. 6 illustrate a configuration of major components within the power supply control unit 84A of the high frequency power supply 36 of the plasma generation system.

The power supply control unit 84A includes, as depicted in FIG. 5, a load power measurement unit 100A and a high frequency power output control unit 102A. The load power measurement unit 100A calculates a measurement value $M_{PL}$ ($M_{PL}=S_{PF}-S_{PR}$) of a load power PL inputted to a load (mainly, plasma) from the progressive wave power detection signal $S_{PF}$ and the reflection wave power detection signal $S_{PR}$ obtained from the RF power monitor 86A.

The load power measurement unit 100A may be implemented by an analog arithmetic circuit or a digital arithmetic circuit. That is, the load power measurement unit 100A may be configured to generate a load power measurement value $M_{PL}$ of an analog signal by calculating a difference between an analog progressive wave power detection signal $S_{PF}$ and an analog reflection wave power detection signal $S_{PR}$, or may be configured to generate a load power measurement value $M_{PL}$ of a digital signal by converting the progressive wave power detection signal $S_{PF}$ and the reflection wave power detection signal $S_{PR}$ into digital signals and then calculating a difference between the two digital signals.

The high frequency power output control unit 102 includes, as depicted in FIG. 6, a first control-instruction-value generating unit 104A for a pulse-on period (first period); a second control-instruction-value generating unit 106A for a pulse-off period (second period); a comparator 108A configured to generate a comparison error $ER_{on}$ or $ER_{off}$ by comparing a first control instruction value $C_{on}$ from the first control-instruction-value generating unit 104A or a second control instruction value $C_{off}$ from the second control-instruction-value generating unit 106A with the progressive wave power detection signal $S_{PF}$ from the RF power monitor 86A; an amplifier control unit 110A configured to control a gain or an amplification factor of the amplifier 82A based on the comparison error $ER_{on}$ or $ER_{off}$ from the comparator 108A; and a controller 112A configured to control the individual components within the high frequency power output control unit 102A.

Here, the first control-instruction-value generating unit 104A receives the load power measurement value $M_{PL}$ inputted from the load power measurement unit 100A and a load power set value $PL_S$ inputted from the main control unit 72 via the controller 112A, and generates the first control instruction value $C_{on}$ for feedback control to be applied to the progressive wave power PF during the pulse-on period $T_{on}$ in each cycle of the modulation pulse MS.

Meanwhile, the second control-instruction-value generating unit 106A receives the load power measurement value $M_{PL}$ inputted from the load power measurement unit 100A and the load power set value $PL_S$ inputted from the controller 112A, and generates the second control instruction value $C_{off}$ for feedback control to be applied to the progressive wave power PF during the pulse-off period $T_{off}$ in each cycle of the modulation pulse MS.

Further, each of the first control-instruction-value generating unit 104A and the second control-instruction-value generating unit 106A may be, desirably, implemented by a digital circuit. In such configuration, by providing a digital-analog (D/A) converter at their output ends, the first control instruction value $C_{on}$ and the second control instruction value $C_{off}$ can be outputted as the analog signals.

The first control instruction value $C_{on}$ outputted from the first control-instruction-value generating unit 104A and the second control instruction value $C_{off}$ outputted from the second control-instruction-value generating unit 106A are sent to the comparator 108A via a switching circuit 114A, alternately. The switching circuit 114A is operated under the control of the controller 112A. During the pulse-on period $T_{on}$ within each cycle of the modulation pulse MS, the switching circuit 114A selects the first control instruction value $C_{on}$ from the first control-instruction-value generating unit 104A and sends the first control instruction value $C_{on}$ to the comparator 108A, whereas during the pulse-off period $T_{off}$, the switching circuit 114A selects the second control instruction value $C_{off}$ from the second control-instruction-value generating unit 106A and sends the second control instruction value $C_{off}$ to the comparator 108A.

Accordingly, during the pulse-on period $T_{on}$ in each cycle of the modulation pulse MS, the comparator 108A compares the progressive wave power detection signal $S_{PF}$ with the first control instruction value $C_{on}$ to generate a comparison error, i.e., a first comparison error $ER_{on}$ ($ER_{on}=C_{on}-S_{PF}$). Meanwhile, during the pulse-off period $T_{off}$, the comparator 108A compares the progressive wave power detection signal $S_{PF}$ with the second control instruction value $C_{off}$ to generate a comparison error, i.e., a second comparison error $ER_{off}$ ($ER_{off}=C_{off}-S_{PF}$).

The amplifier control unit 110A is operated under the controller 112A. During the pulse-on period $T_{on}$ in each cycle of the modulation pulse MS, the amplifier control unit 110A controls an output of the high frequency power supply 36 by varying the gain or the amplification factor of the power amplifier 82A such that the first comparison error $ER_{on}$ approximates to zero (0), whereas during the pulse-off period $T_{off}$, the amplifier control unit 110A controls the output of the high frequency power supply 36 by varying the gain or the amplification factor of the power amplifier 82A such that the second comparison error $ER_{off}$ approximates to zero (0).

Further, a linear amplifier may be appropriately used as the power amplifier 82A, and a differential amplifier may be used as the comparator 108A, for example. In the comparator 108A, a regular proportional relationship between the difference ($C_{on}$–$S_{PF}$ or $C_{off}$–$S_{PF}$) of the input signal and the comparison error $ER_{on}$ or $ER_{off}$ of the output signals needs to be established.

Figure 7:
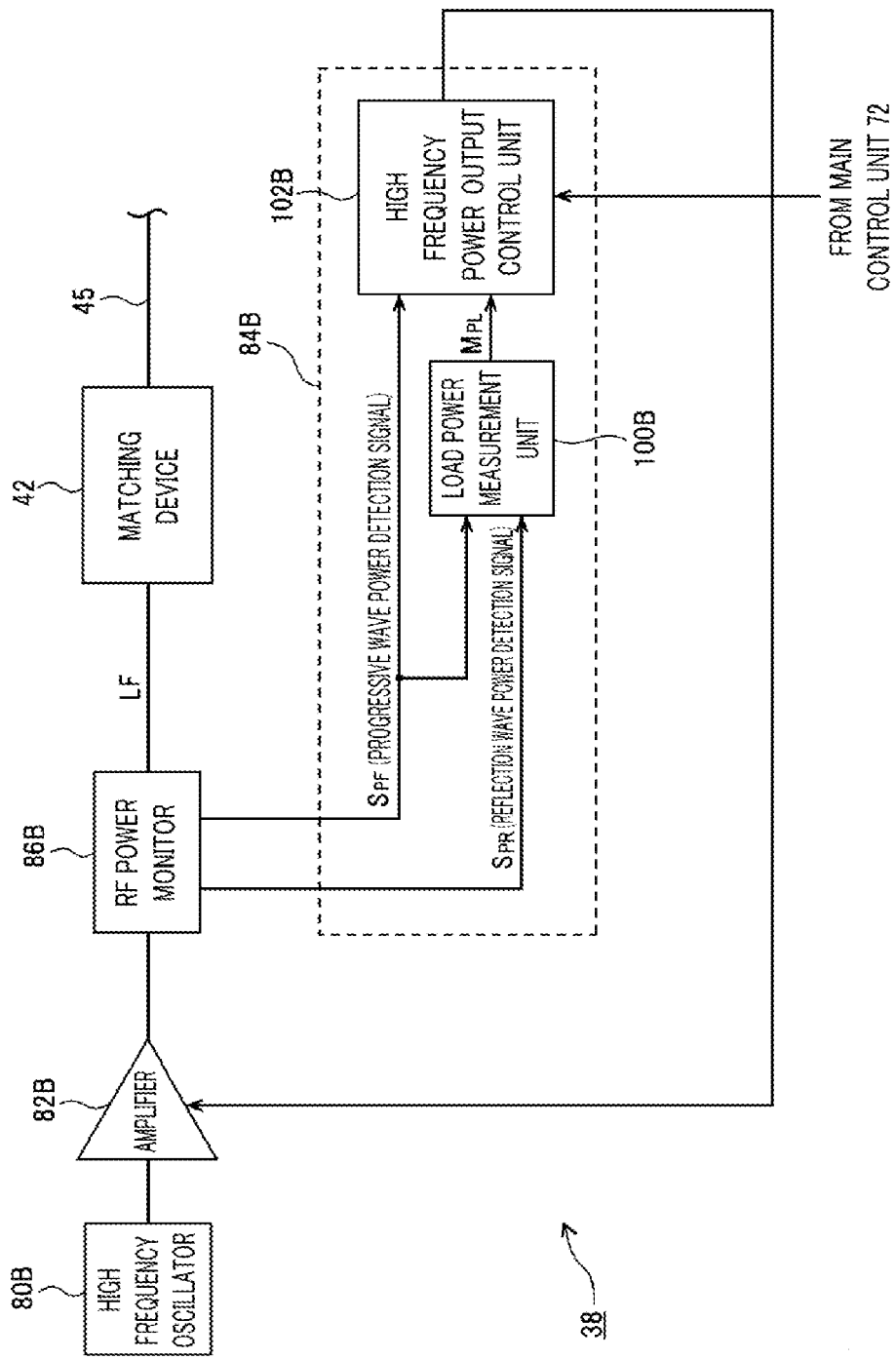
FIG. 7 is a block diagram illustrating a power supply control unit and a RF power monitor of FIG. 4.
Figure 8:
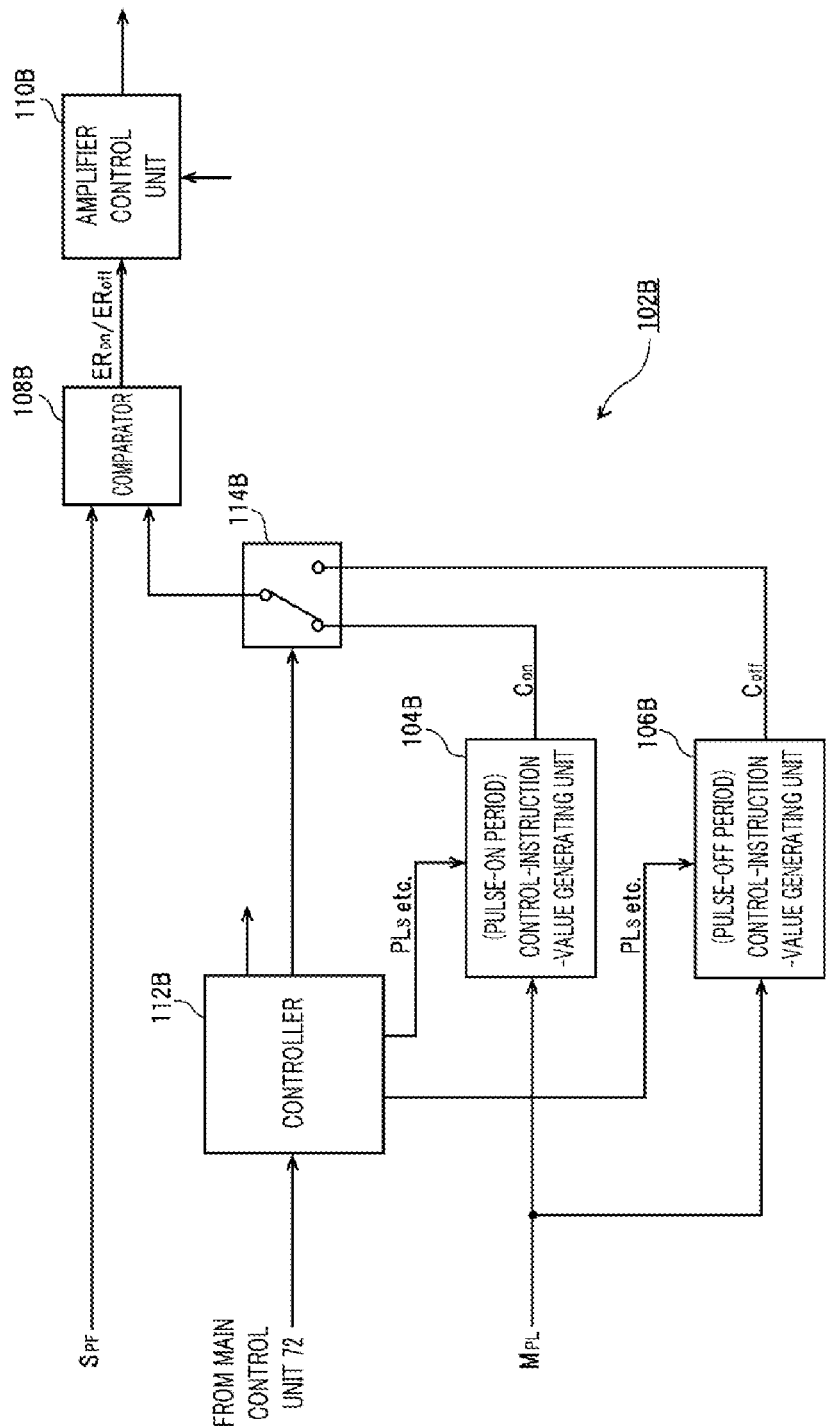
FIG. 8 is a block diagram illustrating an internal configuration of a high frequency power output control unit of FIG. 7.

FIG. 7 and FIG. 8 illustrate a configuration of major components within the power supply control unit 84B of the high frequency power supply 38 of the ion attraction system.

The power supply control unit 84B includes, as depicted in FIG. 7, a load power measurement unit 100B and a high frequency power output control unit 102B. The high frequency power output control unit 102B includes, as depicted in FIG. 8, a first control-instruction-value generating unit 104B, a second control-instruction-value generating unit 106B, a comparator 108B, an amplifier control unit 110B, a controller 112B and a switching circuit 114B.

The load power measurement unit 100B and the high frequency power output control unit 102B of the power supply control unit 84B have the same configuration and operation as those of the load power measurement unit 100A and the high frequency power output control unit 102A of the power supply control unit 84A of the above-described plasma generation system excepting that analog signals indicating the progressive wave power PF and the reflection wave power PR corresponding to the high frequency power LF for ion attraction propagating on the high frequency transmission line 45, i.e., the progressive wave power detection signal $S_{PF}$ and the reflection wave power detection signal $S_{PR}$ are inputted to the power supply control unit 84B from the RF power monitor 86B.

<PL Control in Accordance with Example Embodiment>

In the plasma processing apparatus in accordance with the present example embodiment, each of the high frequency power supplies 36 and 38 is configured to perform a PL control for controlling a net high frequency power inputted to the load (mainly, plasma), i.e., the load power PL to be constant when they are supplying the high frequency power HF for plasma generation and the high frequency power LF for ion attraction into the chamber 10, respectively.

Below, operations of the PL control in accordance with the present example embodiment will be described. As an example, it is assumed that the second power modulation method is performed on a certain plasma process in this plasma processing apparatus.

In this case, to the power supply control unit 84B of the high frequency power supply 38 of the ion attraction system, the main control unit 72 outputs a control signal instructing the power modulation as a RF output mode or data indicating the load power set value $PL_S$ and also outputs the modulation pulse MS as a timing signal for the power modulation. To perform the second power modulation method, the power supply control unit 84B turns on and off the high frequency oscillator 80B in synchronization with the modulation pulse MS and controls the power amplifier 82B such that the power of the high frequency power LF is equal to or approximate to a set value.

Meanwhile, to the power supply control unit 84A of the high frequency power supply 36 of the plasma generation system, the main control unit 72 outputs a control signal instructing a continuous wave CW as the RF output mode or data indicating the load power set value $PL_S$, and also outputs the same pulse as the modulation pulse MS or a pulse in synchronization with the modulation pulse MS as a timing signal for the PL control. The high frequency power supply 36 performs the PL control as described below on the high frequency power HF of the continuous wave CW outputted from the high frequency power supply 36.

That is, the load power set value $PL_S$ from the main control unit 72 is set in the controller 112A within the high frequency power output control unit 102A. The controller 112A sends the load power set value $PL_S$, a control signal and a clock signal to the first control-instruction-value generating unit 104A and the second control-instruction-value generating unit 106A.

In each cycle of the modulation pulse MS, the first control-instruction-value generating unit 104A receives the load power measurement values $M_{PL}$ from the load power measurement unit 100A during the pulse-on period $T_{on}$ to use them as feedback signal. Here, typically, an average value (desirably, a moving average value) of the load power measurement values $M_{PL}$ may be used as the feedback signal, though an instantaneous value or a representative value of the load power measurement values $M_{PL}$ may be used as the feedback signal as well.

To elaborate, a moving average value $AM_{PL}$ of the load power measurement values $M_{PL}$ inputted from the load power measurement unit 100A during the pulse-on period $T_{on}$ is calculated for multiple cycles of the modulation pulse MS, and a comparison error or a deviation is calculated by comparing the moving average value $AM_{PL}$ with the load power set value $PL_S$. Then, a target value for the feedback control to be applied to the progressive wave power PF during the pulse-on period $T_{on}$, i.e., the first control instruction value $C_{on}$ is determined such that the deviation value approaches zero (0) at a proper speed in a subsequent or following cycle of the modulation pulse MS. To determine the first control instruction value $C_{on}$, a well-known algorithm commonly used in the typical feedback control or feed forward control may be utilized.

Meanwhile, in each cycle of the modulation pulse MS, the second control-instruction-value generating unit 106A receives the load power measurement values $M_{PL}$ from the load power measurement unit 100A during the pulse-off period $T_{off}$ to use them as feedback signal. Here, typically, an average value (desirably, a moving average value) of the load power measurement values $M_{PL}$ may be used as the feedback signal, though an instantaneous value or a representative value of the load power measurement values $M_{PL}$ may be used as the feedback signal as well.

To elaborate, a moving average value $BM_{PL}$ of the load power measurement values $M_{PL}$ inputted from the load power measurement unit 100A during the pulse-off period $T_{off}$ is calculated for a single cycle or multiple cycles of the modulation pulse MS, and a comparison error or a deviation is calculated by comparing the moving average value $BM_{PL}$ with the load power set value $PL_S$. Then, a target value for the feedback control to be applied to the progressive wave power PF during the pulse-off period $T_{off}$, i.e., the second control instruction value $C_{off}$ is determined such that the deviation value approaches zero (0) at a proper speed in a subsequent or following cycle of the modulation pulse MS. To determine the second control instruction value $C_{off}$, a well-known algorithm commonly used in the typical feedback control or feed forward control may be utilized.

As stated above, in each cycle of the modulation pulse MS, the comparator 108A generates the comparison error (first comparison error) $ER_{on}$ by comparing the progressive wave power detection signal $S_{PF}$ with the first control instruction value $C_{on}$ from the first control-instruction-value generating unit 104A during the pulse-on period $T_{on}$, and generates the comparison error (second comparison error) $ER_{off}$ by comparing the progressive wave power detection signal $S_{PF}$ with the second control instruction value $C_{off}$ from the second control-instruction-value generating unit 106A during the pulse-off period $T_{off}$. Further, in each cycle of the modulation pulse MS, the amplifier control unit 110A controls the gain or the amplification factor of the power amplifier 82A such that the first comparison error $ER_{on}$ approximates to zero (0) during the pulse-on period $T_{on}$ and the second comparison error $ER_{off}$ approximates to zero (0) during the pulse-off period $T_{off}$.

Accordingly, in the high frequency power supply 36 that outputs the high frequency power HF for plasma generation as the continuous wave CW in the second power modulation method, independent feedback controls are performed on the output of the high frequency power supply 36, i.e., the progressive wave power PF propagating on the high frequency transmission line 43 in the forward direction during the pulse-on period $T_{on}$ and the pulse-off period $T_{off}$ in each cycle of the modulation pulse MS, respectively, such that the measurement value $M_{PS}$ of the load power PL, which is obtained from the RF power monitor 86A and the load power measurement unit 100A, is equal to or approximate to the load power set value $PL_S$.

Typically, when using the second power modulation method in a plasma process, the high frequency power LF for ion attraction to be pulse-modulated is turned on and off at a frequency and a duty ratio of the modulation pulse MS. Accordingly, the load (plasma) fluctuates greatly between the pulse-on period $T_{on}$ and the pulse-off period $T_{off}$, so that the power of the reflection wave power PR may be greatly changed.

Figure 9:
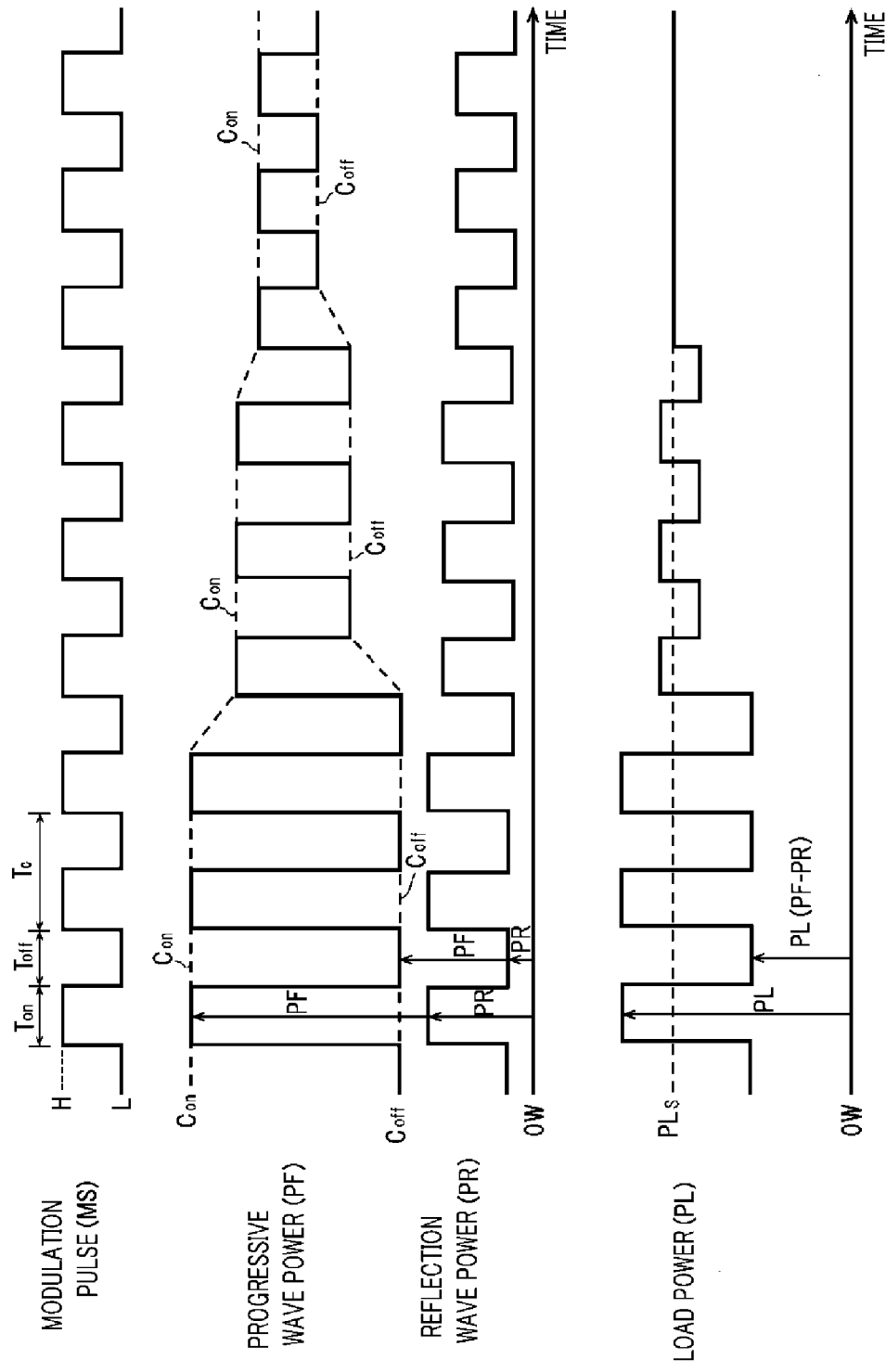
FIG. 9 provides diagrams showing waveforms of respective components for describing an operation of the high frequency power output control unit of FIG. 5.

According to the PL control method in accordance with the present example embodiment, however, as schematically depicted in FIG. 9, for example, the target values for the feedback control to be applied to the progressive wave power PF as the control parameters, i.e., the control instruction values are switched between the independent values $C_{on}$ and $C_{off}$ for the pulse-on period $T_{on}$ and the pulse-off period $T_{off}$, respectively. Accordingly, in each cycle of the modulation pulse MS, a first feedback control for making the progressive wave power PF approximate to the first control instruction value $C_{on}$ (further, for making the load power PL approximate to the set value $PL_S$) is performed during the pulse-on period $T_{on}$, whereas a second feedback control for making the progressive wave power PF approximate to the second control instruction value $C_{off}$ (further, for making the load power PL approximate to the set vale $PL_S$) is performed during the pulse-off period $T_{off}$.

According to this dual feedback control system, it is possible to easily and effectively follow up the periodic variation of the reflection wave power PR and the progressive wave power PF in synchronization with the modulation pulse MS. Further, it is also possible to easily follow up the rapid load variation that occurs when the modulation pulse MS is inverted. Therefore, the load power PL can be stably maintained at the set value $PL_S$.

Furthermore, in the example of FIG. 9, the first control instruction value $C_{on}$ and the second control instruction value $C_{off}$ are updated for every three cycles of the modulation pulse MS. This update speed defines a response speed of the feedback control and can be selected as required.

Meanwhile, in the high frequency power supply 38 configured to pulse-modulate the high frequency power LF for ion attraction under the second power modulation method, the feedback control for the PL control is performed on the progressive wave power PF only during the pulse-on period $T_{on}$ in each cycle of the modulation pulse MS under the control of the power supply control unit 84B. In this case, the controller 112B within the power supply control unit 84B controls the second control-instruction-value generating unit 106B for the pulse-off period to be completely paused or in a non-active state to operate only the first control-instruction-value generating unit 104B for the pulse-on period.

The comparator 108B generates the comparison error (first comparison error) $ER_{on}$ by comparing the progressive wave power detection signal $S_{PF}$ from the RF power monitor 86B with the first control instruction value $C_{on}$ from the first control-instruction-value generating unit 104B only during the pulse-on period $T_{on}$ in each cycle of the modulation pulse MS. During the pulse-off period $T_{off}$, the comparator 108B is substantially paused. The amplifier control unit 110B controls the gain or the amplification factor of the power amplifier 82B such that the first comparison error $ER_{on}$ approximates to zero (0) during the pulse-on period $T_{on}$ in each cycle of the modulation pulse MS. During the pulse-off period $T_{off}$, the amplifier control unit 110B is substantially paused.

In the high frequency power supply 38 in which the high frequency power is pulse-modulated, the PF control may also be performed. In such a case, the progressive wave power set value $PF_S$ needs to be sent to the comparator 108B, not to the controller 112B, as a comparison reference value.

In case that the first power modulation method is performed on the plasma process in this plasma processing apparatus, with respect to the power feedback control, the above-described operations within the high frequency power supply 36 of the plasma generation system (particularly, the power supply control unit 84A) and the above-described operations within the high frequency power supply 38 of the ion attraction system (particularly, the power supply control unit 84B) are reversed from each other.

<Configuration Example of Control-Instruction-Value Generating Unit>

Figure 10:
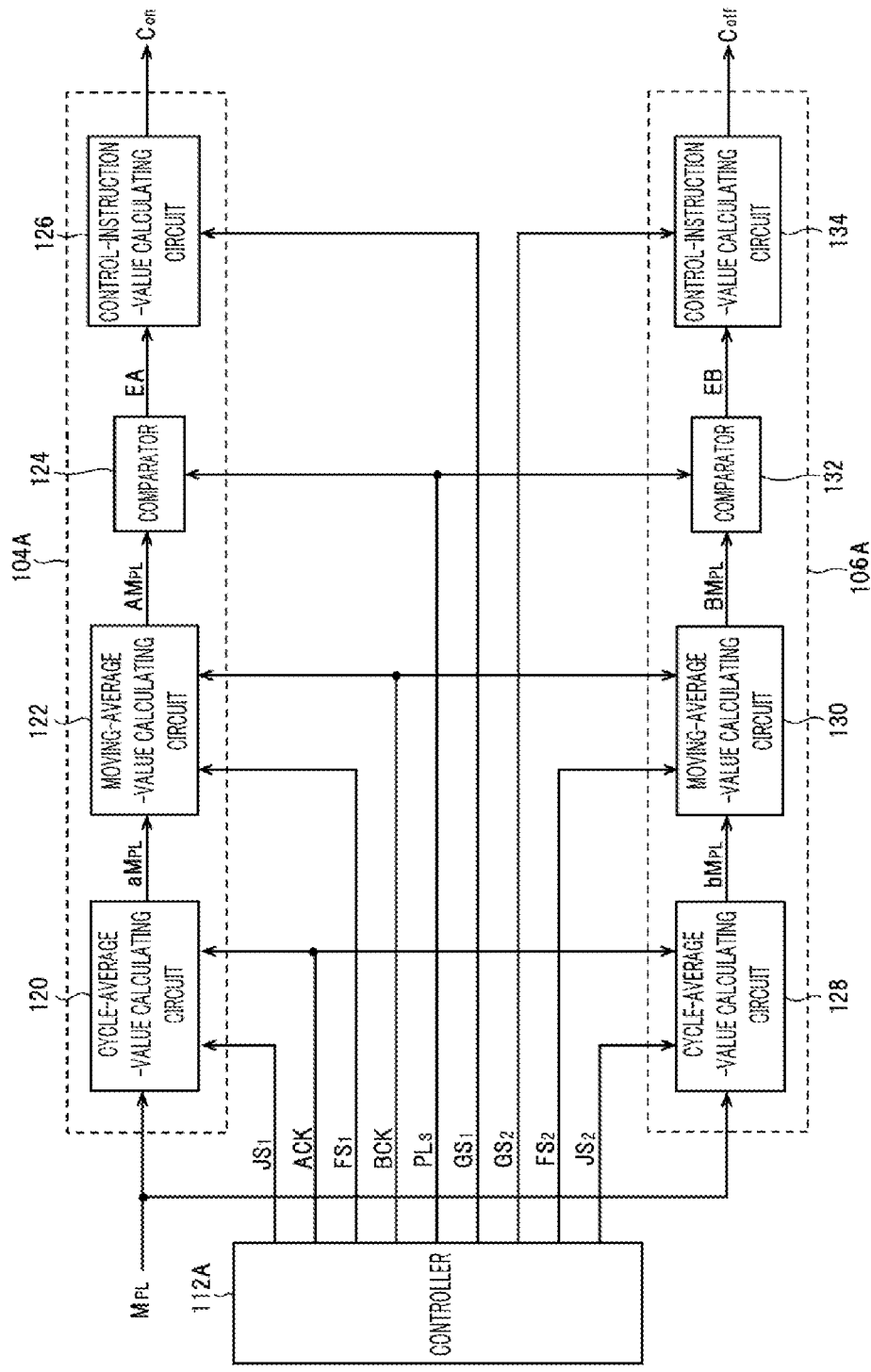
FIG. 10 is a block diagram illustrating an example circuit configuration of a control-instruction-value generating unit in accordance with the example embodiment.
Figure 11:
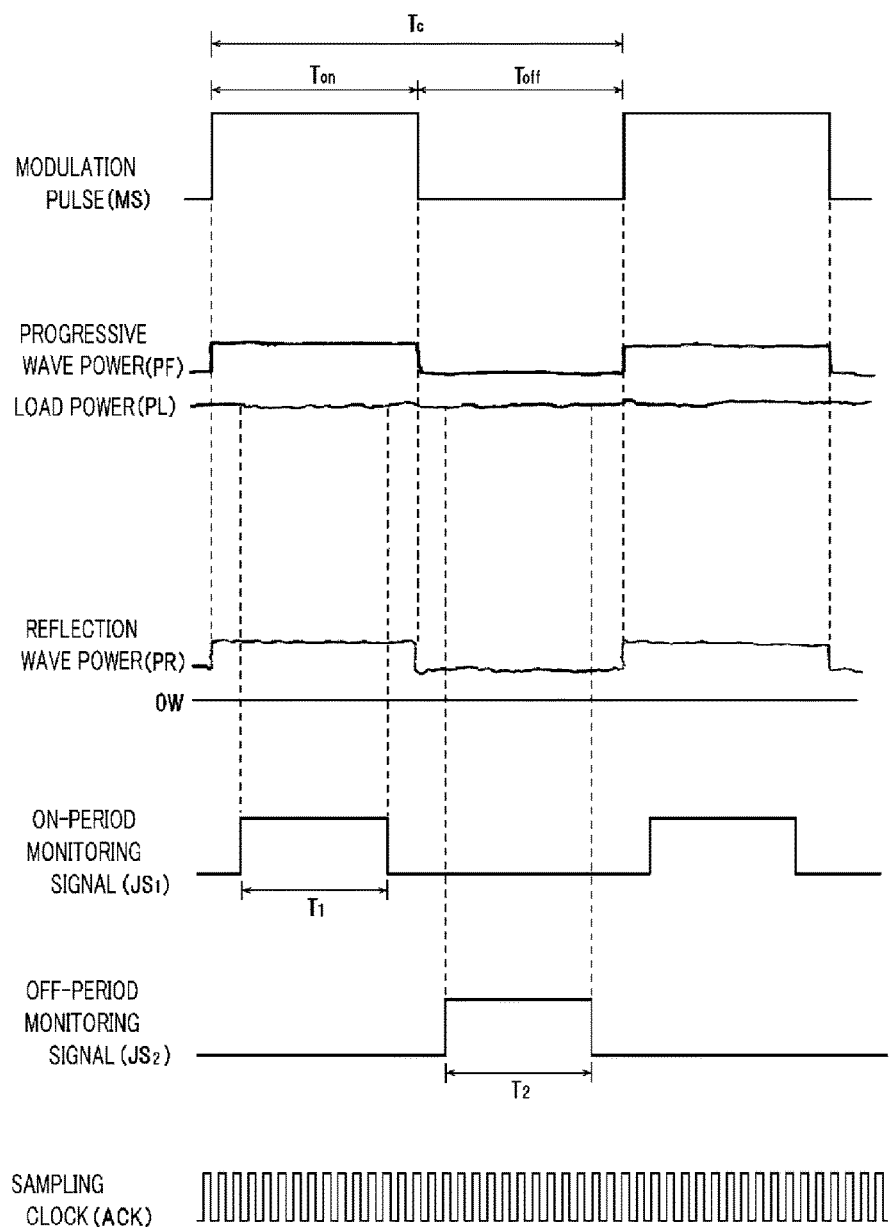
FIG. 11 provides diagrams showing waveforms of respective components for describing an operation of the control-instruction-value generating unit of FIG. 10.
Figure 14:
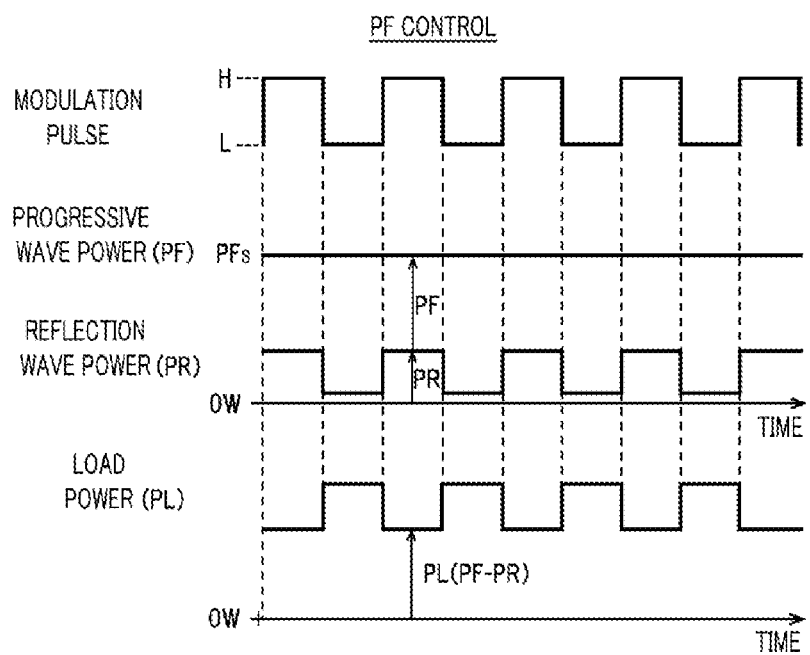
FIG. 14 provides diagrams showing waveforms of respective components for describing a PF control method and a problem thereof.
Figure 15:
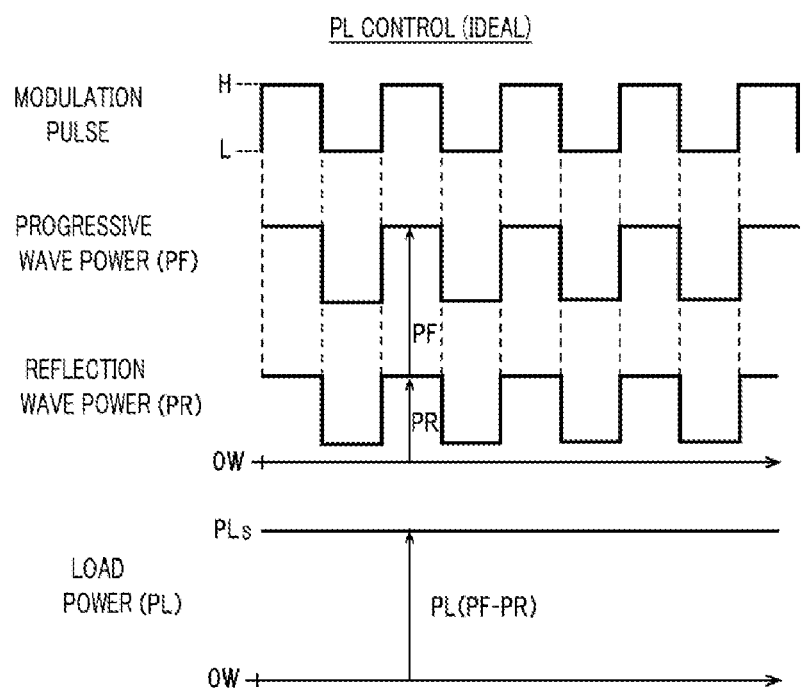
FIG. 15 provides diagrams showing waveforms of respective components for describing a PL control method (ideal method)
Figure 16:
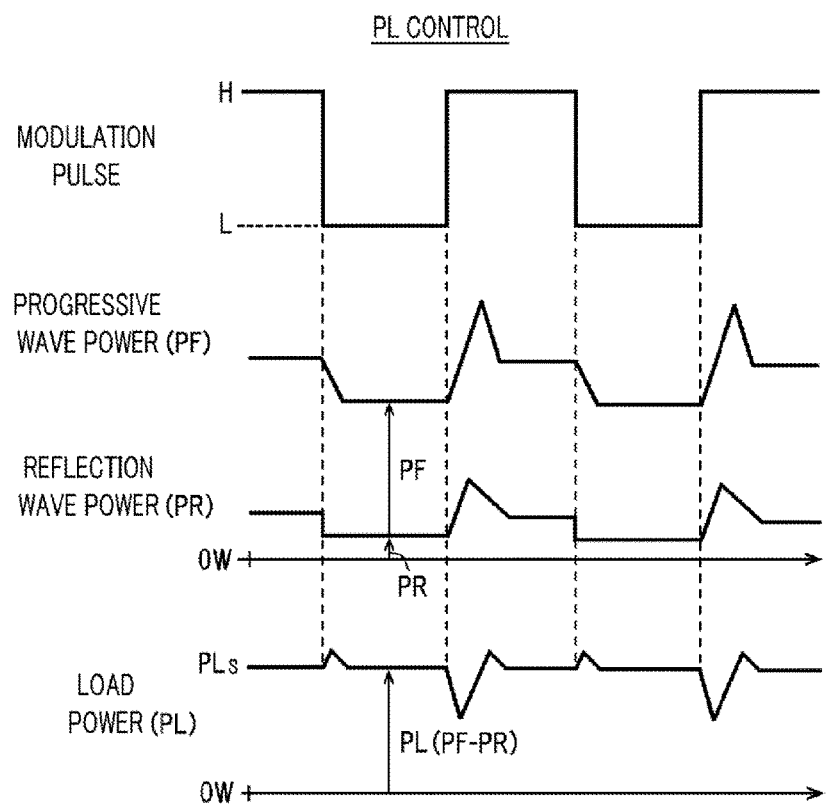
FIG. 16 provides diagrams showing waveforms of respective components for describing a problem of a conventional PL control process.

FIG. 10 illustrates a specific configuration example of the first control-instruction-value generating unit 104A and the second control-instruction-value generating unit 106A which are major components of the high frequency power output control unit 102A in the high frequency power supply 36 of the plasma generation system (power supply control unit 84A). FIG. 11 depicts waveforms of respective components for describing major operations within the control-instruction-value generating units 104A and 106A.

Referring to FIG. 10, the first control-instruction-value generating unit 104A includes a cycle-average-value calculating circuit 120, a moving-average-value calculating circuit 122, a comparator 124 and a control-instruction-value calculating circuit 126.

Here, the cycle-average-value calculating circuit 120 samples load power measurement values $M_{PL}$ from the load power measurement unit 100A with a preset frequency (e.g., several tens of MHz) during a first monitoring time $T_1$ set within the pulse-on period $T_{on}$ in each cycle of the modulation pulse MS, and calculates an average value $aM_{PL}$ for a single cycle (single-cycle average value). The controller 112A sends a clock ACK for the sampling and an on-period monitoring signal $JS_1$ indicating the first monitoring time $T_1$ to the cycle-average-value calculating circuit 120. The cycle-average-value calculating circuit 120 is required to process large amount of signals at a high speed in synchronization with the sampling clock ACK of several tens of MHz, so that a FPGA (Field Programmable Gate Array) may be used appropriately.

The moving-average-value calculating circuit 122 is appropriately composed of a CPU and calculates a moving average value $AM_{PL}$ of the single-cycle average values $aM_{PL}$ of the load power measurement values $M_{PL}$, which are outputted from the cycle-average-value calculating circuit 120 every cycle of the modulation pulse MS, with a preset moving range and a preset moving pitch. By way of example, when the frequency of the modulation pulse MS is 100 Hz, if the moving range and the moving pitch are set to be 100 msec and 20 msec, respectively, a single moving average value $AM_{PL}$ is calculated for ten (10) consecutive single-cycle average values $aM_{PL}$ every 20 msec. The controller 112A sends a control signal $FS_1$ indicating the moving range and the moving pitch and a clock BCK for the calculation of the moving average value to the moving-average-value calculating circuit 122.

The comparator 124 compares the moving average value $AM_{PL}$ obtained from the moving-average-value calculating circuit 122 with the load power set value $PL_S$ and generates a comparison error EA ($EA=PL_S-AM_{PL}$).

The control-instruction-value calculating circuit 126 receives the comparison error EA outputted from the comparator 124 and calculates (generates) a target value for the feedback control of the progressive wave power PF during the pulse-on period $T_{on}$, i.e., the first control instruction value $C_{on}$ through a preset algorithm such that the comparison error EA approximates to zero (0). The controller 112A sends a required control signal and/or timing signal $GS_1$ to the control-instruction-value calculating circuit 126.

Meanwhile, the second control-instruction-value generating unit 106A includes a cycle-average-value calculating circuit 128, a moving-average-value calculating circuit 130, a comparator 132 and a control-instruction-value calculating circuit 134.

Here, the cycle-average-value calculating circuit 128 samples load power measurement values $M_{PL}$ from the load power measurement unit 100A with a preset frequency (e.g., several tens of MHz) during a second monitoring time $T_2$ set within the pulse-off period $T_{off}$ in each cycle of the modulation pulse MS, and calculates an average value $bM_{PL}$ for a single cycle (single-cycle average value). The controller 112A sends a clock ACK for the sampling and an off-period monitoring signal $JS_2$ indicating the second monitoring time $T_2$ to the cycle-average-value calculating circuit 128. The cycle-average-value calculating circuit 128 is required to process large amount of signals at a high speed in synchronization with the sampling clock ACK of several tens of MHz, so that a FPGA (Field Programmable Gate Array) may be used appropriately.

The moving-average-value calculating circuit 130 is appropriately composed of a CPU and calculates a moving average value $BM_{PL}$ of the single-cycle average values $bM_{PL}$ of the load power measurement values $M_{PL}$, which are outputted from the cycle-average-value calculating circuit 128 every cycle of the modulation pulse MS, with a preset moving range and a preset moving pitch. By way of example, when the frequency of the modulation pulse MS is 100 Hz, if the moving range and the moving pitch are set to be 100 msec and 20 msec, respectively, a single moving average value $BM_{PL}$ is calculated for ten (10) consecutive single-cycle average values $bM_{PL}$ every 20 msec. The controller 112A sends a control signal $FS_2$ indicating the moving range and the moving pitch and a clock BCK for the calculation of the moving average value to the moving-average-value calculating circuit 130.

The comparator 132 compares the moving average value $BM_{PL}$ obtained from the moving-average-value calculating circuit 130 with the load power set value $PL_S$ and generates a comparison error EB ($EB=PL_S-BM_{PL}$).

The control-instruction-value calculating circuit 134 receives the comparison error EB outputted from the comparator 132 and calculates (generates) a target value for the feedback control of the progressive wave power PF during the pulse-off period $T_{off}$, i.e., the second control instruction value $C_{off}$ through a preset algorithm such that the comparison error EB approximates to zero (0). The controller 112A sends a required control signal and/or timing signal $GS_2$ to the control-instruction-value calculating circuit 134.

<Effect Investigation of Example Embodiment>

The present inventors have investigated effects of the above-described example embodiment in a plasma etching experiment by using the second power modulation method. In this experiment, the etching gas is $CF_4$, the chamber internal pressure is set to be 13 mTorr, the frequency $f_{HF}$ of the high frequency power HF for plasma generation is set to be 40 MHz, the frequency $f_{LF}$ of the high frequency power LF for ion attraction is set to be 12.88 MHz, and the power (progressive wave power PF) of the high frequency power HF of the continuous wave is set to be 500 W and 100 W (constant). Regarding the plasma stability, the general PF control and the PL control of the example embodiment are compared.

In the experiment for the PF control, as parameters, the set value $PF_S$ of the progressive wave power PF of the high frequency power LF for ion attraction to be pulse-modulated is set to be 25 W, 100 W, 500 W, 1000 W and 2000 W, respectively; the frequency $f_S$ of the power modulation is set to be 0.1 kHz, 1.0 kHz, 10 kHz and 20 kHz, respectively; and the duty ratio DS of the power modulation is set to be 10%, 20%, . . . , 90%, respectively. As a result of the experiment, results of "NG" (plasma hunting) is found in a wide range, as shown in FIG. 12A and FIG. 12B.

In the experiment for the PL control according to the example embodiment, as parameters, the set value $PF_S$ of the load power PL of the high frequency power LF for ion attraction to be pulse-modulated is set to be 25 W, 100 W, 500 W, 1000 W and 2000 W, respectively; the frequency $f_S$ of the power modulation is set to be 0.1 kHz, 1.0 kHz, 10 kHz and 20 kHz, respectively; and the duty ratio DS of the power modulation is set to be 10%, 20%, . . . , 90%, respectively. As a result of the experiment, results of "OK" (plasma stabilization) is found in all cases, as shown in FIG. 13A and FIG. 13B.

<Other Example Embodiments or Modification Examples>

While the present disclosure has been described with respect to the example embodiments, the example embodiments are not intended to be limiting, and various modifications may be made without departing from the scope and sprit of the present disclosure.

In the example embodiments, as the first power modulation method, a first period during which the high frequency power HF for plasma generation is maintained at a first level (H level) and a second period during which the high frequency power HF is maintained at a second level (L level) lower than the first level (H level) may be repeated alternately at a certain pulse frequency. Likewise, as the second power modulation method, a first period during which the high frequency power LF for ion attraction is maintained at a first level (H level) and a second period during which the high frequency lower LF is maintained at a second level (L level) lower than the first level (H level) may be repeated alternately at a certain pulse frequency.

In the above-described example embodiments (FIG. 1), the high frequency power HF for plasma generation is applied to the susceptor (lower electrode) 16. However, the high frequency power HF for plasma generation may be applied to the upper electrode 46 instead.

The example embodiments may not be limited to the capacitively coupled plasma etching apparatus and can be applied to a capacitively coupled plasma processing apparatus configured to perform various plasma processes such as plasma CVD, plasma ALD, plasma oxidation, plasma nitrification, sputtering, and so forth. Furthermore, the example embodiments may also be applied to an inductively coupled plasma processing apparatus in which a high frequency electrode (antenna) is provided in the vicinity of a chamber. Further, the processing target object of the example embodiments may not be limited to the semiconductor wafer, but various types of substrates for a flat panel display, an organic EL or a solar cell, or a photo mask, a CD substrate, and a printed circuit board may also be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing apparatus of generating plasma by high frequency discharge of a processing gas within a decompression processing vessel that accommodates therein a processing target object, which is loaded into and unloaded from the processing vessel, and performing a process on the processing target object within the processing vessel under the plasma, the plasma processing apparatus comprising:
   a first high frequency power supply configured to output a first high frequency power;
   a first high frequency transmission line configured to transmit the first high frequency power outputted from the first high frequency power supply to a first electrode provided within or in the vicinity of the processing vessel;
   a second high frequency power supply configured to output a second high frequency power;
   a second high frequency transmission line configured to transmit the second high frequency power outputted from the second high frequency power supply to the first electrode or a second electrode provided within or in the vicinity of the processing vessel; and
   a power modulation unit configured to pulse-modulate an output of the second high frequency power supply with a pulse such that a first period during which the second high frequency power is turned on or has a first level and a second period during which the second high frequency power is turned off or has a second level lower than the first level are repeated alternately at a regular frequency,
   wherein the first high frequency power supply comprises:
   a RF power monitor configured to detect a progressive wave power propagating on the first high frequency transmission line from the first high frequency power supply toward the first electrode in a forward direction and a reflection wave power propagating on the first high frequency transmission line from the first electrode toward the first high frequency power supply in a backward direction, and configured to generate a progressive wave power detection signal indicating the progressive wave power and a reflection wave power detection signal indicating the reflection wave power;
   a load power measurement unit configured to calculate a measurement value of a load power applied to a load including the plasma from the progressive wave power detection signal and the reflection wave power detection signal obtained from the RF monitor; and
   a high frequency power output control unit configured to perform feedback controls on the progressive wave power during the first period and the second period, independently and respectively, in each cycle of the pulse such that the measurement value of the load power obtained from the load power measurement unit is equal to or approximate to a preset load power set value.

2. The plasma processing apparatus of claim 1,
   wherein the high frequency power output control unit comprises:
   a first control-instruction-value generating unit configured to generate a first control instruction value for the feedback control to be applied to the progressive wave power during the first period based on the load power measurement value obtained from the load power measurement unit and the load power set value;
   a second control-instruction-value generating unit configured to generate a second control instruction value for the feedback control to be applied to the progressive wave power during the second period based on the load power measurement value obtained from the load power measurement unit and the load power set value; and
   a comparator configured to generate, in each cycle of the pulse, a first comparison error during the first period by comparing the progressive wave power detection signal from the RF power monitor with the first control instruction value from the first control-instruction-value generating unit, and configured to generate a second comparison error during the second period by comparing the progressive wave power detection signal from the RF power monitor with the second control instruction value from the second control-instruction-value generating unit,
   wherein, in each cycle of the pulse, an output of the first high frequency power supply is controlled such that the first comparison error approximates to zero (0) during the first period and the second comparison error approximates to zero (0) during the second period.

3. The plasma processing apparatus of claim 2,
   wherein the first control-instruction-value generating unit is configured to receive the load power measurement value, which is obtained from the load power measurement unit, during a first monitoring time set within the first period in each cycle of the pulse, and configured to generate the first control instruction value based on a deviation between the load power measurement value and the load power set value.

4. The plasma processing apparatus of claim 2,
   wherein the first control-instruction-value generating unit comprises:
   a first cycle-average-value calculating circuit configured to sample load power measurement values, which are obtained from the load power measurement unit, with a preset sampling frequency during a first monitoring time set within the first period in each cycle of the pulse, and configured to calculate an average value of the load power measurement values;
   a first moving-average-value calculating circuit configured to calculate a moving average value of the load power measurement values during the first period based on the average value of the load power measurement values for each cycle of the pulse obtained from the first cycle-average-value calculating circuit; and a first control-instruction-value calculating circuit configured to generate the first control instruction value based on a comparison error between the moving average value of the load power measurement values during the first period, which is obtained from the first moving-average-value calculating circuit, and the load power set value.

5. The plasma processing apparatus of claim 2,
wherein the second control-instruction-value generating unit is configured to receive the load power measurement value, which is obtained from the load power measurement unit, during a second monitoring time set within the second period in each cycle of the pulse, and configured to generate the second control instruction value based on a deviation between the load power measurement value and the load power set value.

6. The plasma processing apparatus of claim 2,
wherein the second control-instruction-value generating unit comprises:
a second cycle-average-value calculating circuit configured to sample load power measurement values, which are obtained from the load power measurement unit, with a preset sampling frequency during a second monitoring time set within the second period in each cycle of the pulse, and configured to calculate an average value of the load power measurement values;
a second moving-average-value calculating circuit configured to calculate a moving average value of the load power measurement values during the second period based on the average value of the load power measurement values for each cycle of the pulse obtained from second cycle-average-value calculating circuit; and
a second control-instruction-value calculating circuit configured to generate the second control instruction value based on a comparison error between the moving average value of the load power measurement values during the second period, which is obtained from the second moving-average-value calculating circuit, and the load power set value.

7. The plasma processing apparatus of claim 2,
wherein the first high frequency power supply comprises:
a high frequency oscillator configured to generate a fundamental wave of the first high frequency power; and
a power amplifier configured to amplify a power of the fundamental wave, which is outputted from the high frequency oscillator, with a controllable gain or amplification factor,
wherein the high frequency power output control unit controls the gain or amplification factor of the power amplifier to vary the output of the first high frequency power supply.

8. The plasma processing apparatus of claim 1,
wherein one of the first high frequency power and the second high frequency power has a frequency suitable for plasma generation, and
the other of the first high frequency power and the second high frequency power has a frequency suitable for ion attraction into the processing target object from the plasma.

* * * * *